(12) United States Patent
Aquilino et al.

(10) Patent No.: US 9,818,741 B2
(45) Date of Patent: Nov. 14, 2017

(54) STRUCTURE AND METHOD TO PREVENT EPI SHORT BETWEEN TRENCHES IN FINFET EDRAM

(71) Applicant: International Business Machines Corporation, Armonk, NY (US)

(72) Inventors: Michael V. Aquilino, Wappingers Falls, NY (US); Veeraraghavan S. Basker, Schenectady, NY (US); Kangguo Cheng, Schenectady, NY (US); Gregory Costrini, Hopewell Junction, NY (US); Ali Khakifirooz, Los Altos, CA (US); Byeong Y. Kim, LaGrangeville, NY (US); William L. Nicoll, Pleasant Valley, NY (US); Ravikumar Ramachandran, Pleasantville, NY (US); Reinaldo A. Vega, Wappingers Falls, NY (US); Hanfei Wang, White Plains, NY (US); Xinhui Wang, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 27 days.

(21) Appl. No.: 14/755,404

(22) Filed: Jun. 30, 2015

(65) Prior Publication Data

US 2017/0005098 A1 Jan. 5, 2017

(51) Int. Cl.
*H01L 27/108* (2006.01)
*H01L 27/08* (2006.01)
*H01L 27/12* (2006.01)

(52) U.S. Cl.
CPC .... *H01L 27/0817* (2013.01); *H01L 27/10826* (2013.01); *H01L 27/10829* (2013.01); *H01L 27/10867* (2013.01); *H01L 27/10879* (2013.01); *H01L 27/1203* (2013.01)

(58) Field of Classification Search
None
See application file for complete search history.

(56) References Cited

U.S. PATENT DOCUMENTS

| | | |
|---|---|---|
| 6,452,224 B1 | 9/2002 | Mandelman et al. |
| 6,534,814 B2 | 3/2003 | Iba et al. |
| 6,699,794 B1 | 3/2004 | Flietner et al. |
| 6,872,619 B2 | 3/2005 | Chen et al. |
| 6,951,822 B2 | 10/2005 | Scholz |
| 7,122,437 B2 | 10/2006 | Dyer et al. |
| 7,682,897 B2 | 3/2010 | Wu et al. |

(Continued)

*Primary Examiner* — Ali Naraghi
(74) *Attorney, Agent, or Firm* — Scully, Scott, Murphy & Presser, P.C.; Steven J. Meyers

(57) ABSTRACT

After forming a laterally contacting pair of a semiconductor fin and a conductive strap structure having a base portion vertically contacting a deep trench capacitor embedded in a substrate and a fin portion laterally contacting the semiconductor fin, conducting spikes that are formed on the sidewalls of the deep trench are removed or pushed deeper into the deep trench. Subsequently, a dielectric cap that inhibits epitaxial growth of a semiconductor material thereon is formed over at least a portion of the base portion of the conductive strap structure. The dielectric cap can be formed either over an entirety of the base portion having a stepped structure or on a distal portion of the base portion.

13 Claims, 31 Drawing Sheets

(56) References Cited

U.S. PATENT DOCUMENTS

| | | | |
|---|---|---|---|
| 7,713,814 B2 | 5/2010 | Cheng et al. | |
| 7,791,124 B2 * | 9/2010 | Cheng | H01L 21/84 257/301 |
| 8,860,112 B2 | 10/2014 | Basker et al. | |
| 2013/0320422 A1 * | 12/2013 | Chang | H01L 27/10826 257/301 |
| 2014/0070294 A1 | 3/2014 | Faltermeier et al. | |

* cited by examiner

STRUCTURE AND METHOD TO PREVENT EPI SHORT BETWEEN TRENCHES IN FINFET EDRAM

BACKGROUND

The present application relates to semiconductor device fabrication, and more particularly to semiconductor structures and methods that prevent electrical shorts between adjacent deep trenches containing embedded dynamic random access memory (eDRAM) devices.

Deep trench capacitors are used in a variety of semiconductor chips for high areal capacitance and low device leakage. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio-frequency (RF) circuit.

A deep trench capacitor is typically electrically connected to associated transistors through a conductive strap structure. Since the conductive strap is normally composed of a conductive semiconductor material such as doped polysilicon, and during later selective epitaxy processes in the formation of source/drain regions, the epitaxial growth of a semiconductor material may occur on the surface of the conductive strap structure. As dimensions of semiconductor devices scale, the distance between neighboring deep trenches becomes smaller. The epitaxial grown semiconductor material on the conductive strap structure may extend out of the deep trench to bridge the neighboring deep trenches, causing shorts between the neighboring deep trench capacitors. As such, structures and methods are needed to prevent epitaxial shorts between adjacent deep trenches having eDRAM devices.

SUMMARY

The present application provides methods and structures that allow effective prevention of electrical shorts between neighboring deep trenches caused by an epitaxial overgrowth of a semiconductor material on a conductive strap structure employed to connect a deep trench capacitor embedded within the deep trench and associated transistors during the formation of source/drain regions in fin field effect transistors (FinFETs). After forming a laterally contacting pair of a semiconductor fin and a conductive strap structure having a base portion vertically contacting a deep trench capacitor embedded in a substrate and a fin portion laterally contacting the semiconductor fin, conducting spikes that are formed on the sidewalls of the deep trench are removed or pushed deeper into the deep trench. Subsequently, a dielectric cap that inhibits epitaxial growth of a semiconductor material thereon is formed over at least a portion of the base portion of the conductive strap structure. The dielectric cap can be formed either over an entirety of the base portion having a stepped structure or on a distal portion of the base portion.

In one aspect of the present application, a semiconductor structure is provided. The semiconductor structure includes a semiconductor fin located on a substrate, a deep trench capacitor located in a lower portion of a deep trench in the substrate, and a conductive strap structure located over the deep trench capacitor. The conductive strap structure comprises a stepped base portion vertically contacting the deep trench capacitor and a fin portion extending from the base portion and laterally contacting the semiconductor fin. The stepped base portion has a first recessed surface located below a topmost surface of the substrate by a first depth and a second recessed surface located below the topmost surface of the substrate by a second depth that is greater than the first depth. The semiconductor structure further includes a dielectric cap located over the base portion of the conductive strap structure and completely filling the deep trench.

In another aspect of the present application, a method of forming a semiconductor structure is provided. The method includes forming a deep trench extending through a top semiconductor layer, a buried insulator layer and into a handle substrate of a semiconductor-on-insulator (SOI) substrate. A deep trench capacitor is then formed in a lower portion of the deep trench. After forming a conductive material cap over the deep trench capacitor to completely fill the deep trench, a laterally contacting pair of a semiconductor fin and a conductive strap structure is formed by patterning the top semiconductor layer and the conductive material cap and removing unwanted portions of remaining portions of the top semiconductor layer and the conductive material cap. The conductive strap structure includes a stepped base portion vertically contacting the deep trench capacitor and a fin portion extending from the base portion and laterally contacting the semiconductor fin. Next, a dielectric cap is formed over the stepped base portion of the conductive strap structure to fill the deep trench.

In another aspect of the present application, a semiconductor structure is provided. The semiconductor structure includes a fin stack that includes a dielectric fin and a semiconductor fin atop the dielectric fin located on a substrate, a deep trench capacitor located in a lower portion of a deep trench in the substrate, and a conductive strap structure located over the deep trench capacitor. The conductive strap structure includes a base portion vertically contacting the deep trench capacitor and a fin portion extending from the base portion and laterally contacting the fin stack. The base portion has a proximal portion over which the fin portion extends and a distal portion that is away from the fin stack. The semiconductor structure further includes a dielectric cap located over the distal portion of the base portion and completely filling the deep trench.

In yet another aspect of the present application, a method of forming a semiconductor structure is provided. The method includes forming a deep trench extending through a top semiconductor layer, a buried insulator layer and into a handle substrate of a semiconductor-on-insulator (SOI) substrate. A deep trench capacitor is then formed in a lower portion of the deep trench. After forming a conductive material cap over the deep trench capacitor to completely fill the deep trench, a laterally contacting pair of a semiconductor fin and a conductive strap structure is formed by patterning the top semiconductor layer and the conductive material cap and removing unwanted portions of remaining portions of the top semiconductor layer and the conductive material cap. The conductive strap structure includes a base portion vertically contacting the deep trench capacitor and a fin portion extending from a proximal portion of the base portion and adjoined to the semiconductor fin. Next, a dielectric cap layer is formed over the laterally contacting pair of the semiconductor fin and the conductive strap structure and the buried insulator layer. The dielectric cap layer and the buried insulator layer are recessed to provide a dielectric cap over a distal portion of the base portion of the conductive strap structure adjoined to the proximal portion.

DETAILED DESCRIPTION

Figure 1A:
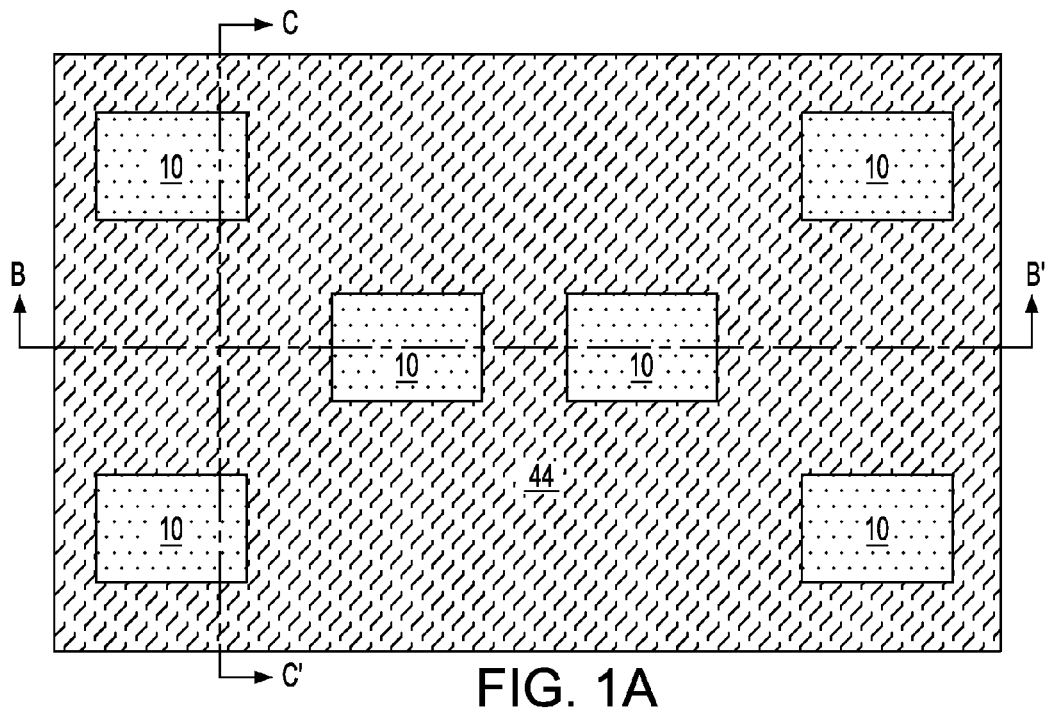
FIG. 1A is a top-down view of a first exemplary semiconductor structure after forming deep trenches within a semiconductor-on-insulator (SOI) substrate according to a first embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
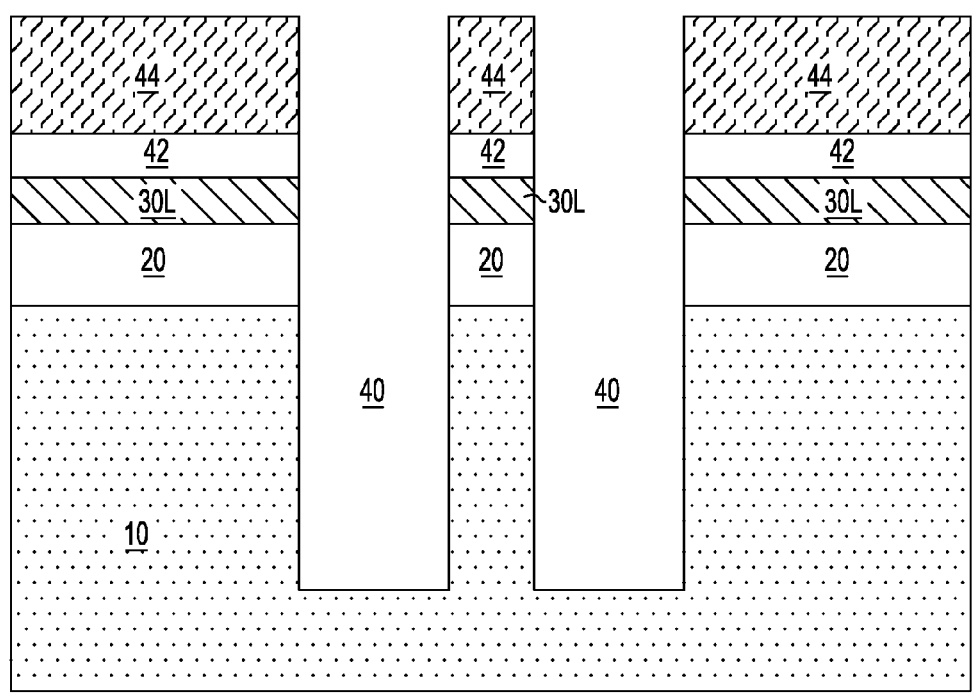
FIG. 1B is a cross-sectional view of the first exemplary semiconductor structure of FIG. 1A along the vertical plane B-B'.
Figure 1C:
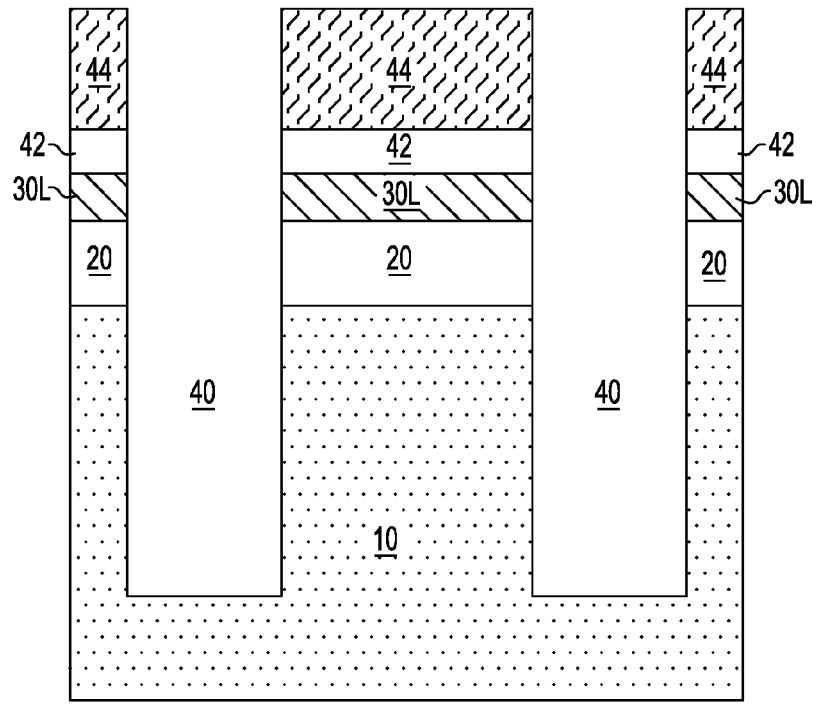
FIG. 1C is a cross-sectional view of the first exemplary semiconductor structure of FIG. 1A along the vertical plane C-C'.

Referring to FIGS. 1A-1C, a first exemplary semiconductor structure according to a first embodiment of the present application includes a semiconductor-on-insulator (SOI) substrate having deep trenches 40 formed therein. The SOI substrate includes a stack of, from bottom to top, a handle substrate 10, a buried insulator layer 20, and a top semiconductor layer 30L. In some embodiments of the present application, an optional n-doped epitaxial semiconductor layer may be present between the handle substrate 10 and the buried insulator layer 20 (not shown).

The handle substrate 10 may include a semiconductor material, such as, for example, Si, Ge, SiGe, SiC, SiGeC, a compound semiconductor material such as a III-V compound semiconductor material or a II-VI compound semiconductor material, or a combination thereof. In one embodiment, the handle substrate 10 is composed of single crystalline silicon. The thickness of the handle substrate 10 can be from 50 µm to 2 mm, although lesser and greater thicknesses can also be employed.

The buried insulator layer 20 may include a dielectric material such as silicon dioxide, silicon nitride, silicon oxynitride, or a combination thereof. In one embodiment, the buried insulator layer 20 may be formed by a deposition process, such as chemical vapor deposition (CVD) or physically vapor deposition (PVD). In another example, the buried insulator layer 20 may be formed using a thermal growth process, such as thermal oxidation, to convert a surface portion of the handle substrate 10. In yet another embodiment, the buried insulator layer 20 can be formed during a SIMOX process in which oxygen ions are implanted into a semiconductor wafer and thereafter an anneal is performed to provide the SOI substrate. The thickness of the buried insulator layer 20 that is formed can be from 50 nm to 200 nm, although lesser or greater thicknesses can also be employed.

The top semiconductor layer 30L may include a semiconductor material, such as, for example, Si, Ge, SiGe, SiC, SiGeC, a compound semiconductor material such as a III-V compound semiconductor material or a II-VI compound semiconductor material, or a combination thereof. The semiconductor materials of the top semiconductor layer 30L and the handle substrate 10 may be the same or different. In one embodiment, the top semiconductor layer 30L includes a single crystalline semiconductor material, such as, for example, single crystalline silicon. The top semiconductor layer 30L may be doped with p-type dopants and/or n-type dopants. Examples of p-type dopants include, but are not limited to, boron, aluminum, gallium and indium. Examples of n-type dopants, include but are not limited to, antimony, arsenic and phosphorous. The top semiconductor layer 30L may be formed by wafer bonding or layer transfer techniques during which a semiconductor layer is transferred from a donor wafer to a receiver wafer containing the handle substrate 10 and the buried insulator layer 20. When a layer transfer process is employed, an optional thinning step may follow the bonding of two semiconductor wafers together. The optional thinning step reduces the thickness of the semiconductor layer to a layer having a thickness that is more desirable. The top semiconductor layer 30L that is formed may have a thickness from 10 nm to 200 nm, although lesser or greater thicknesses can also be employed.

At least one pad layer can be deposited on the SOI substrate (10, 20, 30L), for example, by CVD or atomic layer deposition (ALD). The at least one pad layer can include one or more layers that can be employed as an etch mask for the subsequent formation of the deep trenches 40 in the SOI substrate (10, 20, 30L). As used herein, a "deep trench" refers to a trench that extends from a topmost surface of a SOI substrate through a top semiconductor layer and a buried insulator layer and partly into an underlying semiconductor layer. The pad layer(s) can include a dielectric material and can have a thickness from 100 nm to 2 µm, although lesser and greater thicknesses can also be employed.

In one embodiment, the at least one pad layer can include a vertical stack of, from bottom to top, a pad oxide layer 42 and a pad nitride layer 44. The pad oxide layer 42 may include a dielectric oxide material such as silicon dioxide or a dielectric metal oxide. The pad nitride layer 44 may include a dielectric nitride material such as silicon nitride or a dielectric metal nitride. In one embodiment, the thickness of the pad oxide layer 42 can be from 2 nm to 50 nm, and the thickness of the pad nitride layer 44 can be from 40 nm to 360 nm, although lesser and greater thicknesses can also be employed for each of the pad oxide layer 42 and the pad nitride layer 34.

A photoresist layer (not shown) can be applied over the pad nitride layer 44 and is lithographically patterned to form openings. Each of the openings has an area of a deep trench 40 to be subsequently formed. In one embodiment, the pattern for the openings can have a periodicity along at least one horizontal direction. In one embodiment, the pattern for the openings can be periodic in two orthogonal horizontal directions.

The pattern in the photoresist layer can be transferred into the at least one pad layer (42, 44) to form openings in the at least one pad layer (42, 44). Subsequently, the pattern in the at least one pad layer (42, 44) can be transferred through the top semiconductor layer 30L, the buried insulator layer 20, and an upper portion of the handle substrate 10 or an upper portion of the n-doped epitaxial semiconductor layer, if present, by an anisotropic etch that employs the at least one pad layer (42, 44) as an etch mask. The deep trenches 40 can thus be formed in the SOI substrate (10, 20, 30L) from the pattern of openings in the at least one pad layer (42, 44). The photoresist can be removed by ashing, or can be consumed during the etch process that forms the deep trenches 40.

In one embodiment and as shown in FIGS. 1B and 1C, the sidewalls of the deep trench can be substantially vertically aligned among the various layers (10, 20, 30L) through which the deep trench 40 extends. The depth of the deep trenches 40 as measured from the topmost surface of the SOI substrate (10, 20, 30L) (i.e., the top surface of the top semiconductor layer 30L) to the bottom surface of the deep trenches 40 can be from 500 nm to 10 microns, although lesser and greater depths can also be employed. The width (i.e., the lateral distance between opposite sidewalls) of the deep trenches 40 can be from 40 nm to 150 nm, although lesser and greater width can also be employed. In one embodiment, the width of each deep trench 40 is 90 nm.

Figure 2A:
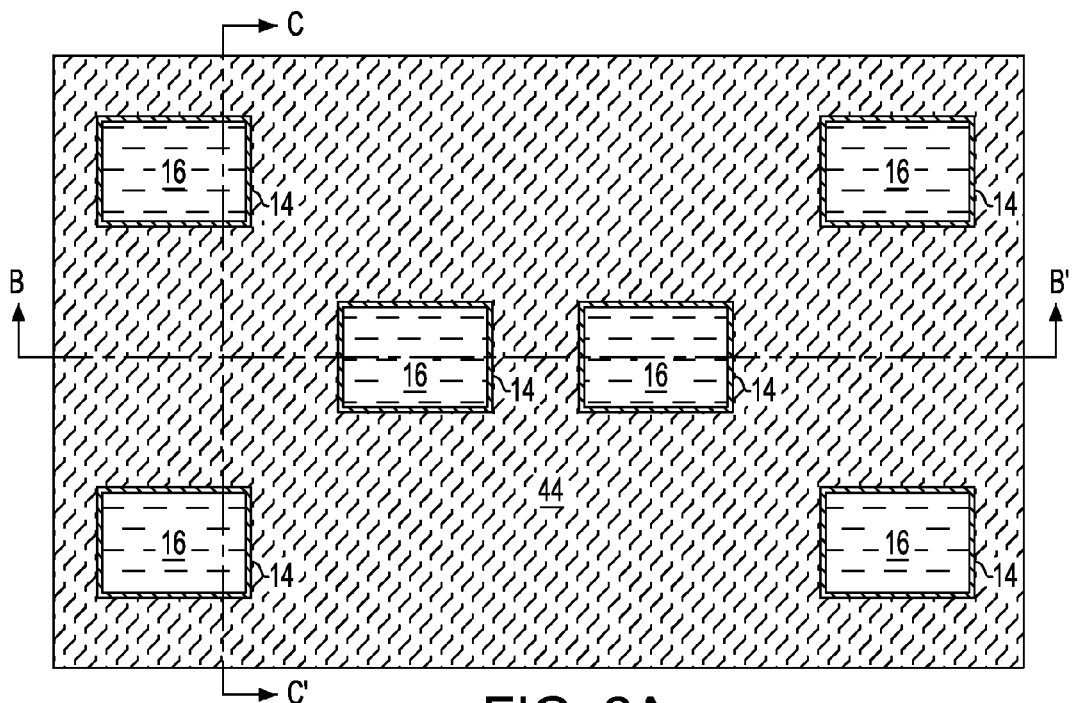
FIG. 2A is a top-down view of the first exemplary semiconductor structure of FIGS. 1A-1C after forming deep trench capacitors.
Figure 2B:
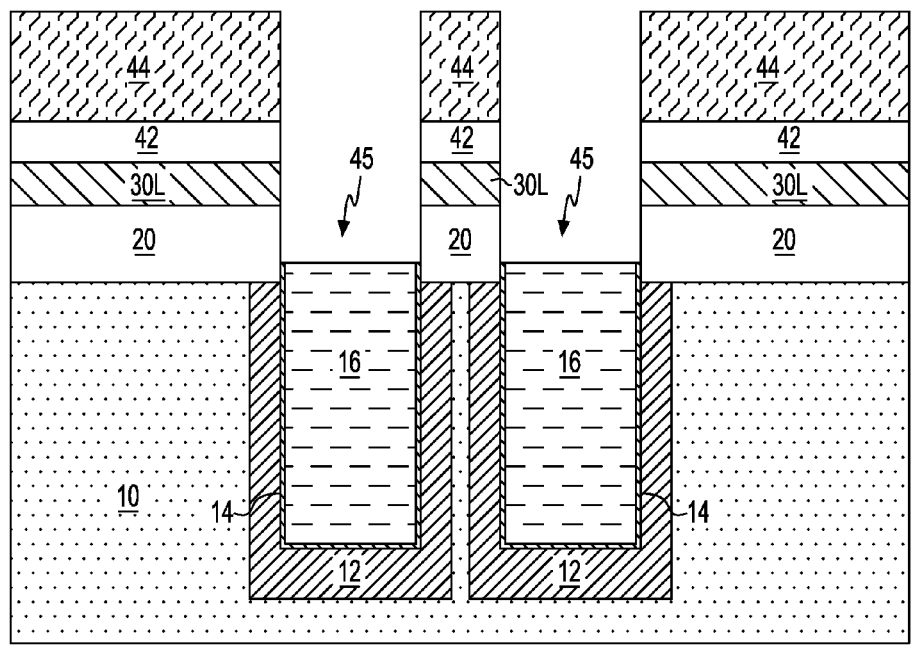
FIG. 2B is a cross-sectional view of the first exemplary semiconductor structure of FIG. 2A along the vertical plane B-B'.
Figure 2C:
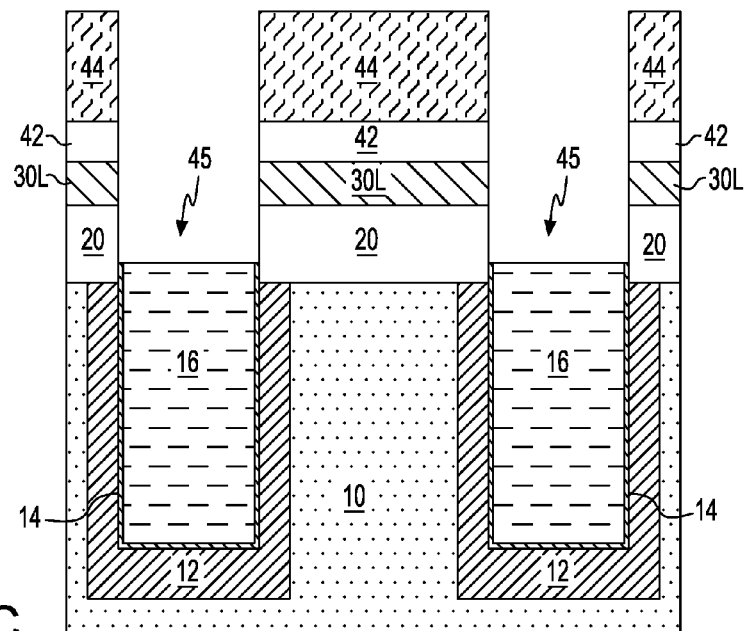
FIG. 2C is a cross-sectional view of the first exemplary semiconductor structure of FIG. 2A along the vertical plane C-C'.

Referring to FIGS. 2A and 2B, a deep trench capacitor (12, 14, 16) is formed in a lower portion of each deep trench 40. In one embodiment, a buried plate 12 can be first formed by doping a portion of the handle substrate 10 in proximity of sidewalls of each deep trench 40. Dopants can be introduced, for example, by outdiffusion from a dopant-including disposable material (such as a doped silicate glass) or by ion implantation as known in the art. Further, any other method of forming buried plates 12 in the handle substrate 10 of the SOI substrate (10, 20, 30L) can be employed in lieu of outdiffusion from a dopant-including disposable material or ion implantation.

In one embodiment and if the handle substrate 10 is doped with dopants of a first conductivity, the buried plate 12 can be doped with dopants of a second conductivity type which is opposite the first conductivity type. For example, the first conductivity type can be p-type and the second conductivity type can be n-type, or vice versa. A p-n junction is thus formed between the remaining portion of the handle substrate 10 and each buried plate 12. The dopant concentration in the buried plate 12 can be, for example, from $1.0 \times 10^{18}/\text{cm}^3$ to $2.0 \times 10^{21}/\text{cm}^3$, and typically from $5.0 \times 10^{18}/\text{cm}^3$ to $5.0 \times 10^{19}/\text{cm}^3$, although lesser and greater dopant concentrations can also be employed.

In another embodiment of the present application and when the n-doped epitaxial semiconductor layer is present, a portion of the n-doped semiconductor layer surrounding each deep trench can serve as an outer electrode for each deep trench capacitor subsequently formed and processing steps of forming the buried plates 12 described above can be omitted.

A node dielectric layer (not shown) can be deposited conformally on sidewalls and bottom surfaces of the deep trenches 40 as well as sidewalls and the topmost surface of the at least one pad layer (42, 44). The node dielectric layer can include any dielectric material that can be employed as a node dielectric material in a capacitor known in the art. For example, the node dielectric layer can include at least one of silicon nitride and a dielectric metal oxide material such as high dielectric constant (high-k) dielectric material as known in the art.

An inner electrode layer (not shown) can be deposited to completely fill the deep trenches 40. The inner electrode layer can include a doped semiconductor material. The doped semiconductor material can be a doped elemental semiconductor material, a doped compound semiconductor material, or an alloy thereof. In one embodiment, the inner electrode layer includes a doped polysilicon. The inner electrode layer can be deposited by PVD, CVD, ALD, electroplating, electroless plating, or a combination thereof. The inner electrode layer is deposited to a thickness that is sufficient to completely fill the deep trenches.

In some embodiments of the present application and before filling the deep trenches with the inner electrode layer, a metal nitride layer (not shown) may be conformally deposited over the node dielectric layer by CVD or ALD. In one embodiment, the metal nitride layer includes TiN. The metal nitride layer is optional and can be omitted.

The inner electrode layer is vertically recessed to a level between the top surface of the buried insulator layer 20 and the bottom surface of the buried insulator layer 20 by a recess etch. The recess etch of the conductive material layer can employ an anisotropic etch such as a reactive ion etch (RIE), an isotropic etch such as a wet chemical etch, or a combination thereof. The recess etch can be selective to the material of the node dielectric layer. Each remaining portion of the inner electrode layer within the deep trenches constitutes an inner electrode 16. The topmost surface of each inner electrode 16 is substantially planar, and is located between the top surface of the buried insulator layer 20 and the bottom surface of the buried insulator layer 20.

The physically exposed portions of the node dielectric layer that are not covered by the inner electrode 16 can be removed by a recess etch, which can be a dry etch, such as, for example, RIE. Each remaining portion of the node dielectric layer within the deep trenches 40 constitutes a node dielectric 14. The topmost surface of the node dielectric 14 is coplanar with the topmost surface of the inner electrode 16.

Each set of a buried plate 12 around a deep trench 40, a node dielectric 14, and an inner electrode 16 constitutes a trench capacitor (12, 14, 16). The buried plate 12 is an outer electrode of the trench capacitor, the inner electrode 16 is the inner electrode of the trench capacitor, and the node dielectric 14 is the dielectric separating the outer electrode (i.e., the buried plate 12) from the inner electrode 16. The trench capacitor (12, 14, 16) is embedded within the SOI substrate (10, 20, 30L). The buried insulator layer 20 overlies, and contacts the buried plates 12. A cavity 45 is formed above the node dielectric 42 and the inner electrode 44 within each deep trench 40.

Figure 3A:
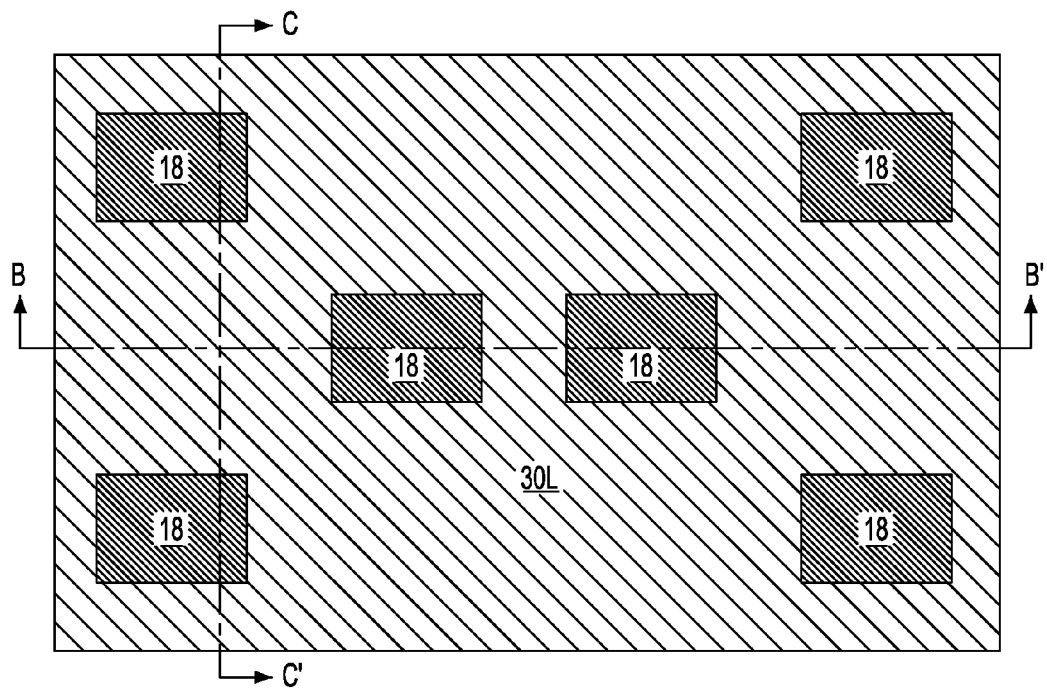
FIG. 3A is a top-down view of the first exemplary semiconductor structure of FIGS. 2A-2C after forming conductive material portions over the deep trench capacitors.
Figure 3B:
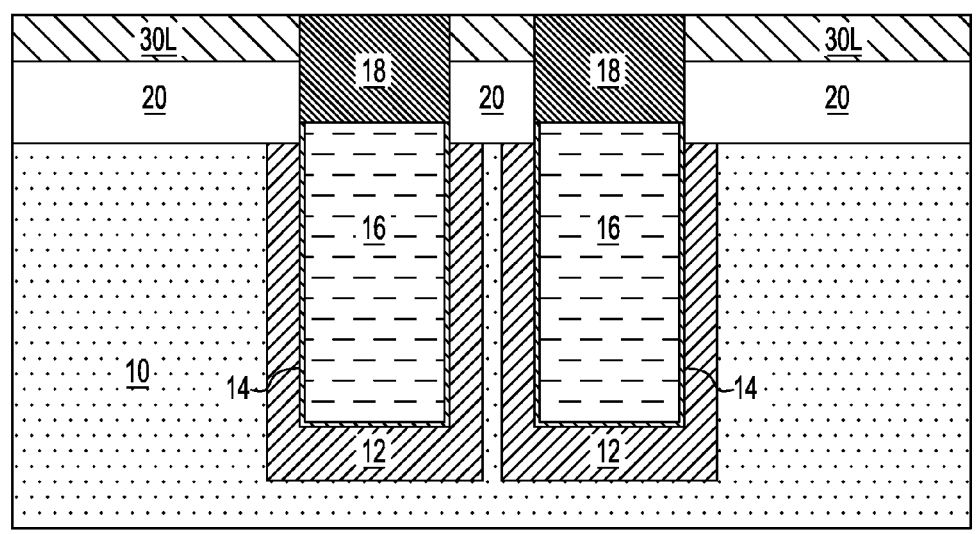
FIG. 3B is a cross-sectional view of the first exemplary semiconductor structure of FIG. 3A along the vertical plane B-B'.
Figure 3C:
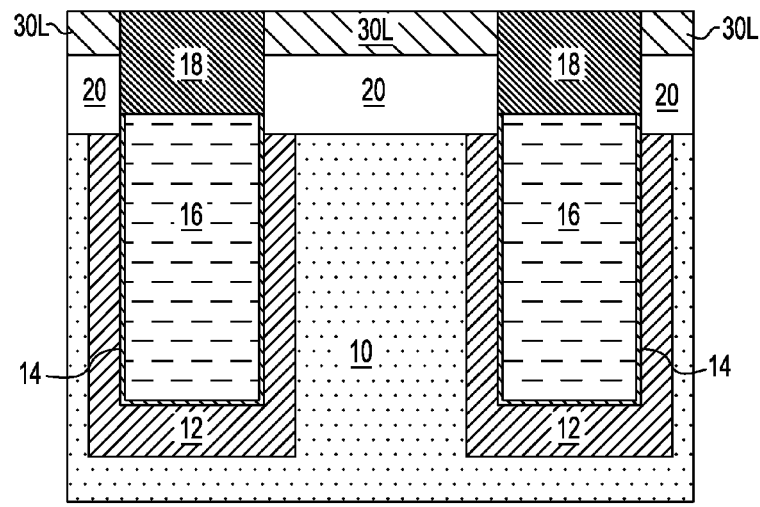
FIG. 3C is a cross-sectional view of the first exemplary semiconductor structure of FIG. 3A along the vertical plane C-C'.

Referring to FIGS. 3A-3C, conductive material caps 18 are formed within the cavities 45 and on top of the node dielectric 14 and the inner electrode 16. The conductive material caps 18 can be formed by depositing a conductive material in the cavities 45 and above the at least one pad layer (42, 44), and subsequently recessing the deposited conductive material. Specifically, the conductive material can be a doped elemental semiconductor material, a doped compound semiconductor material, or an alloy thereof. The semiconductor material can be deposited by CVD or PVD with in-situ doping of p-type dopants or n-type dopants. The conductive material may be deposited to a thickness that is sufficient to completely fill the cavities 45.

The conductive material can be planarized, for example, by chemical mechanical planarization (CMP) employing the pad nitride layer 44 as a stopping layer. Subsequently, the conductive material is recessed to a depth at the top surface of the top semiconductor layer 30L to provide the conductive material portions 18. In one embodiment and as shown in FIGS. 3B and 3C, the top surfaces of the conductive strap structures 18 are substantially coplanar with the top surface of the top semiconductor layer 30L. A recess etch which can be an anisotropic etch such as RIE may be employed to form the conductive material portions 18. Each conductive material cap 18 is in contact with, and overlies, an inner electrode 44.

Subsequently, the at least one pad layer (42, 44) is removed by at least one etch that is selective to the semiconductor materials of the top semiconductor layer 30L and the conductive material portions 18. For example, if the pad nitride layer 44 includes silicon nitride and the pad oxide layer 42 includes silicon dioxide, a wet chemical etch employing hot phosphoric acid can be utilized to etch the pad nitride layer 44 and a wet chemical etch employing hydrofluoric acid can be utilized to etch the pad oxide layer 42.

Figure 4A:
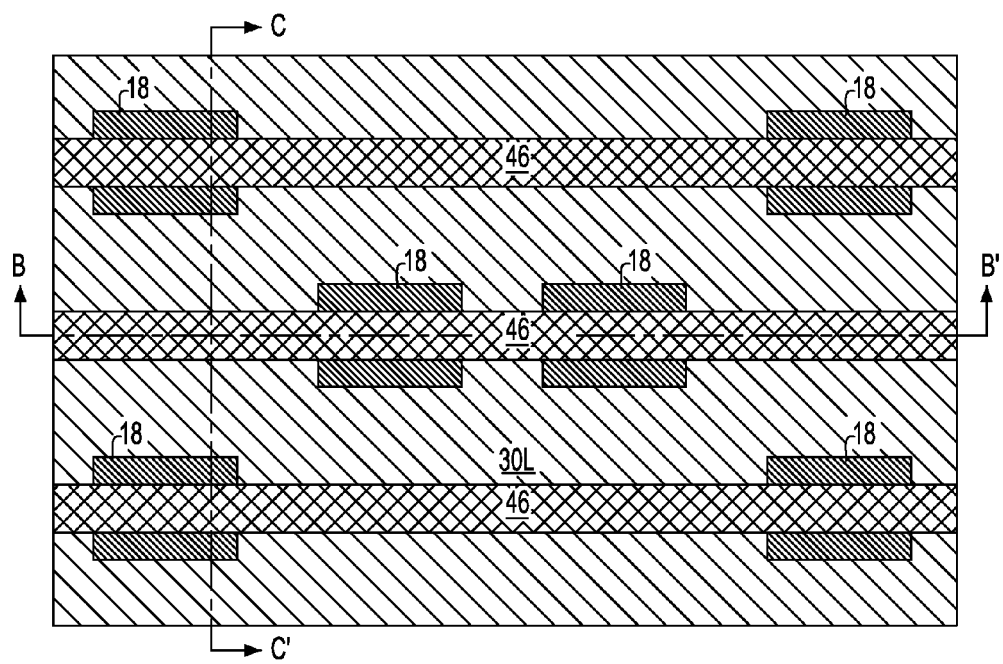
FIG. 4A is a top-down view of the first exemplary semiconductor structure of FIGS. 3A-3C after forming fin-defining mask structures on top surfaces of the top semiconductor layer and the conductive material caps.
Figure 4B:
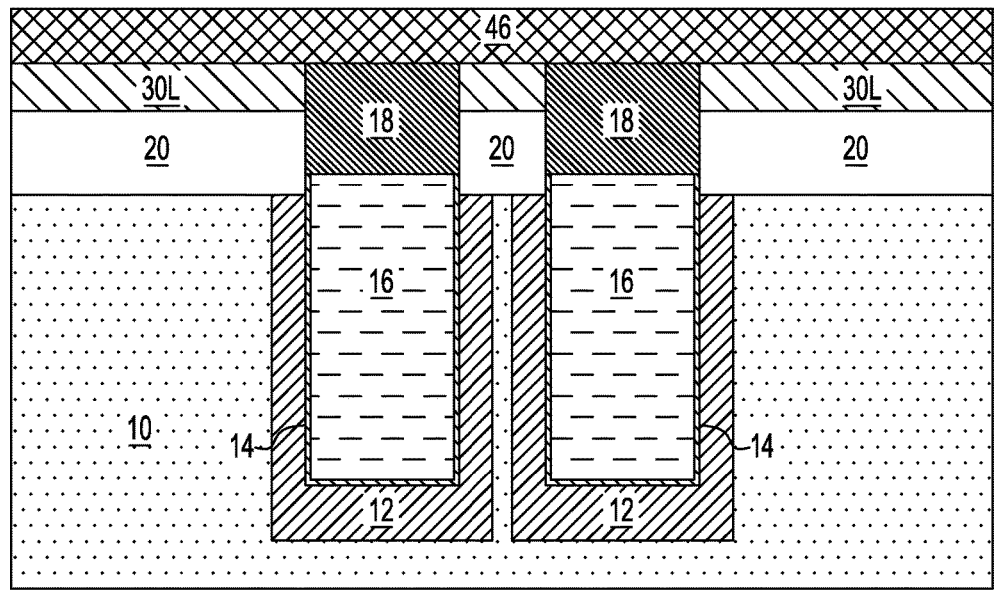
FIG. 4B is a cross-sectional view of the first exemplary semiconductor structure of FIG. 4A along the vertical plane B-B'.
Figure 4C:
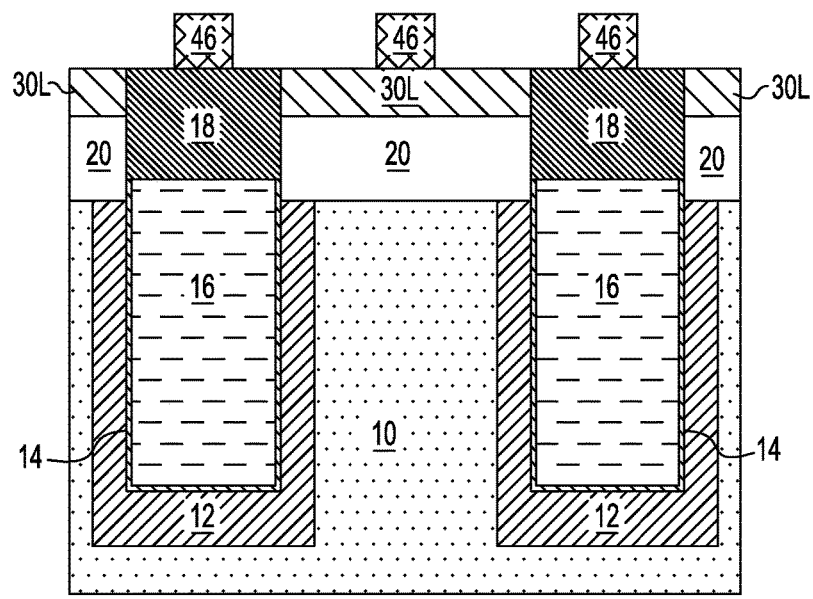
FIG. 4C is a cross-sectional view of the first exemplary semiconductor structure of FIG. 4A along the vertical plane C-C'.

Referring to FIGS. 4A-4C, fin-defining mask structures 46 are formed on top surfaces of the top semiconductor layer 30L and the conductive material caps 18. The fin-defining mask structures 46 are mask structures that cover the regions of the top semiconductor layer 30L from which semiconductor fins are subsequently formed. In one embodiment, each of the fin-defining mask structures 46 can have a rectangular shape and extends along a lengthwise direction. As used herein, a "lengthwise" direction of an object refers to a direction along which the object extends the most. The width (i.e., the lateral distance between opposite sidewalls extending along the lengthwise direction) of the fin-defining mask structures 46 can be from 5 nm to 30 nm, although lesser and greater thicknesses can also be employed.

In one embodiment, the fin-defining mask structures 46 can be patterned portions of a dielectric hardmask layer. The fin-defining mask structures 46 can be formed, for example, by first depositing a dielectric hardmask layer (not shown) over the top semiconductor layer 30L and the conductive material caps 18 and lithographically patterning the dielectric hardmask layer. The dielectric hardmask layer includes a dielectric material such as silicon dioxide, silicon nitride, a dielectric metal oxide, or a combination thereof. In one embodiment, the dielectric hardmask layer includes silicon nitride. The dielectric hardmask layer can be deposited by CVD or ALD. The thickness of the dielectric hardmask layer that is formed can be from 20 nm to 200 nm, although lesser and greater thicknesses can also be employed. The patterning of the dielectric hardmask layer can be performed, for example, by application and lithographic patterning of a photoresist layer, and transfer of the patterns in the photoresist layer into the dielectric material layer by an etch, which can be an anisotropic etch such as RIE. Remaining portions of the photoresist layer can be removed, for example, by ashing.

In another embodiment, the fin-defining mask structures 46 can be formed by a sidewall image transfer (SIT) process. Specifically, after the formation of the dielectric hardmask layer over the top semiconductor layer 30L and the conductive material portions 18, a mandrel material layer (not shown) is deposited over the dielectric hardmask layer. The mandrel material layer may be composed of amorphous silicon, polysilicon, amorphous or polycrystalline germanium, an amorphous or polycrystalline silicon-germanium alloy material, amorphous carbon, diamond-like carbon, or organosilicate glass. The mandrel material layer can be deposited using, for example, CVD or PECVD. The thickness of the mandrel material layer can be from 50 nm to 300 nm, although lesser and greater thicknesses can also be employed. The mandrel material layer then undergoes lithographic and etching processes to form mandrels (not shown). Next, a conformal spacer material layer (not shown) is deposited over the mandrels and exposed portions of the dielectric hardmask layer by a conformal deposition process such as, for example, CVD or ALD. The thickness of the spacer material layer may vary depending upon the desired width of final semiconductor fins to be formed in the top semiconductor layer 30L, and can be from 5 nm to 30 nm, although lesser and greater thicknesses can also be employed. The spacer material layer may include a dielectric material such as silicon dioxide or silicon oxynitride. Horizontal portions of the conformal spacer material layer are then removed utilizing an anisotropic etch, such as, for example, RIE to provide spacers which are remaining portions of the spacer material layer on the sidewalls of the mandrels. The mandrels are removed selective to the spacers, leaving the spacers on top of the dielectric hardmask layer. The removal of the mandrels can be performed, for example, by a wet chemical etch or a dry etch such as RIE. The dielectric hardmask layer is subsequently patterned by an anisotropic etch using the spacers as an etch mask to provide the fin-defining mask structures 46. The spacers are then removed by, for example, a wet chemical etch.

Figure 5A:
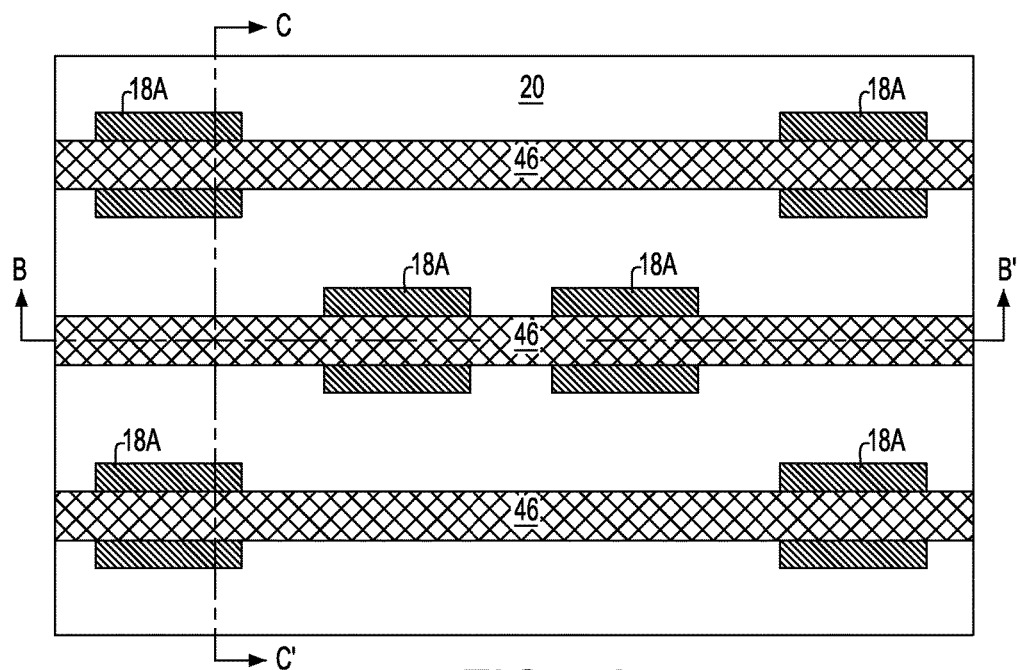
FIG. 5A is a top-down view of the first exemplary semiconductor structure of FIGS. 4A-4C after forming semiconductor layer portions and conductive material cap portions by patterning the top semiconductor layer and the conductive material caps.
Figure 5B:
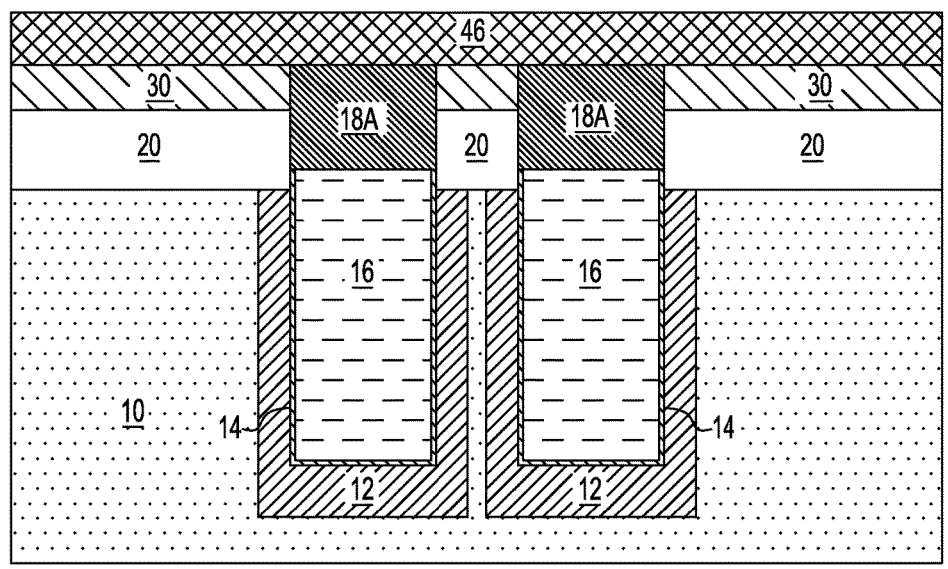
FIG. 5B is a cross-sectional view of the first exemplary semiconductor structure of FIG. 5A along the vertical plane B-B'.
Figure 5C:
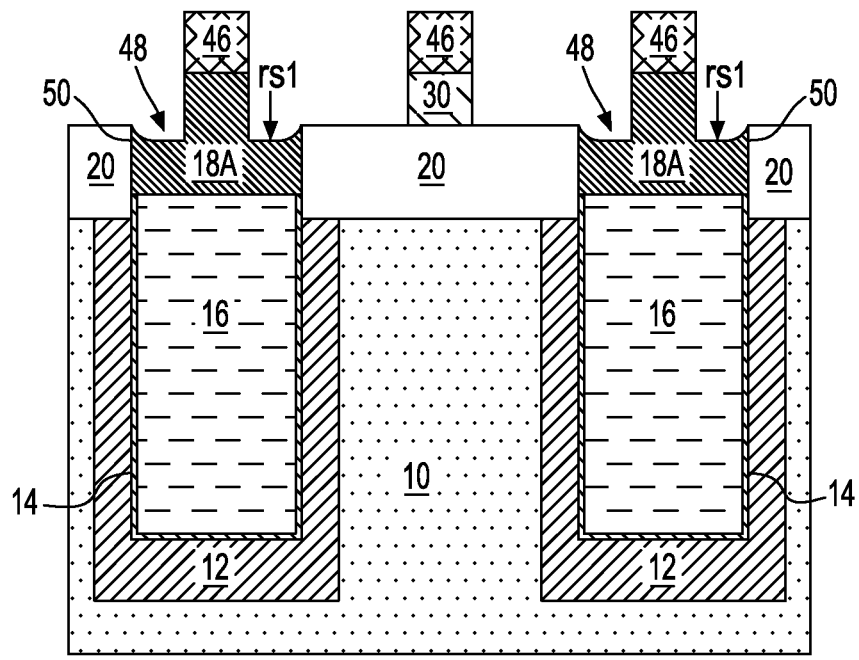
FIG. 5C is a cross-sectional view of the first exemplary semiconductor structure of FIG. 5A along the vertical plane C-C'.

Referring to FIGS. 5A-5C, physically exposed portions of the top semiconductor layer 30L and the conductive material caps 18 are anisotropically etched employing the fin-defining mask structures 46 as an etch mask to provide semiconductor layer portions 30 which are remaining portions of the top semiconductor layer 30L and conductive material cap portions 18A which are remaining portions of the conductive material caps 18. In one embodiment, the anisotropic etch can be a dry etch such as RIE that removes the semiconductor materials of the top semiconductor layer 30L and the conductive material caps 18 selective to the dielectric material of the buried insulator layer 20. The top surface of the buried insulator layer 20 is thus exposed after the patterning of the top semiconductor layer 30L and the conductive material caps 18.

Figure 6:
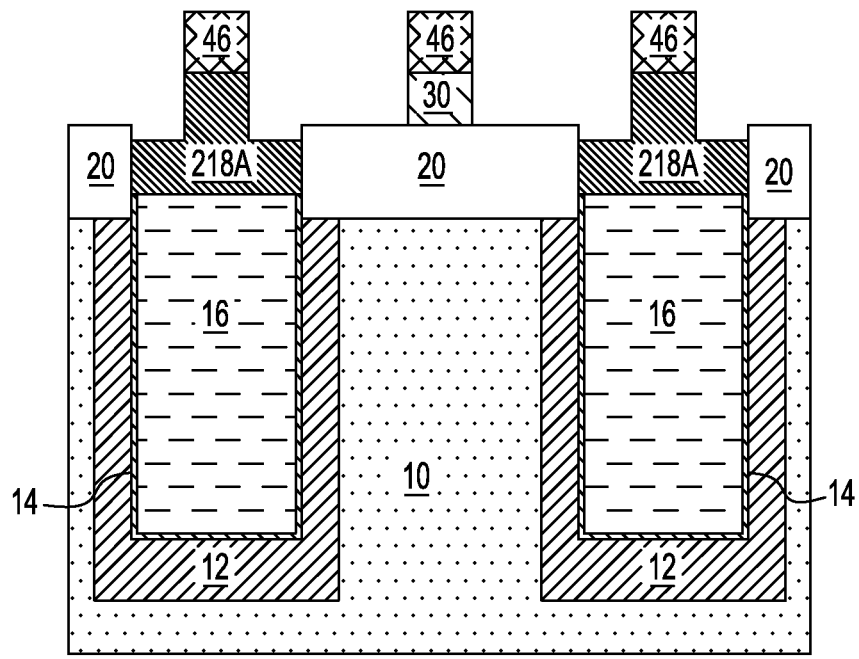
FIG. 6 is a cross-sectional view of the first exemplary semiconductor structure of FIG. 5A along the vertical plane C-C' illustrating the conductive cap portion having a base portion with a planar surface.

At the end of the anisotropic etch, the exposed portions of the conductive material caps 18 may be recesses to a depth beneath the top surface of the buried insulator layer 20, thereby forming a recessed area 48 with a recess surface, $rs_1$, in the upper portion of each deep trench 40. In one embodiment of the present application and as shown in FIG. 5C, when the anisotropic etch employed to pattern the exposed portions of the top semiconductor layer 30L and the conductive material caps 18 is not ideally anisotropic, such a non-ideal anisotropic etch profile may cause portions the conductive material portions 18 along the sidewalls of the deep trenches 40 not to be completely etched away, leaving conductive material spikes 50 along the sidewalls of the upper portion of each deep trench 40. By "conductive metal spike" it is meant a vertical portion of the conductive material portions 18 that remains along an upper portion of the sidewall surfaces of the buried insulator layer 20. The conductive material spikes 50 need to be removed because semiconductor material epitaxially grown upon these conductive material spikes 50 in downstream processes may short adjacent cells which leads to the failure of deep trench capacitors (12, 14, 16). In another embodiment of the present application and as shown in FIG. 6, the anisotropic etch recesses the conductive material cap 18 without the formation of the conductive material spikes 50, thus producing conductive material cap portions 218A each with a planar recessed surface.

Figure 7A:
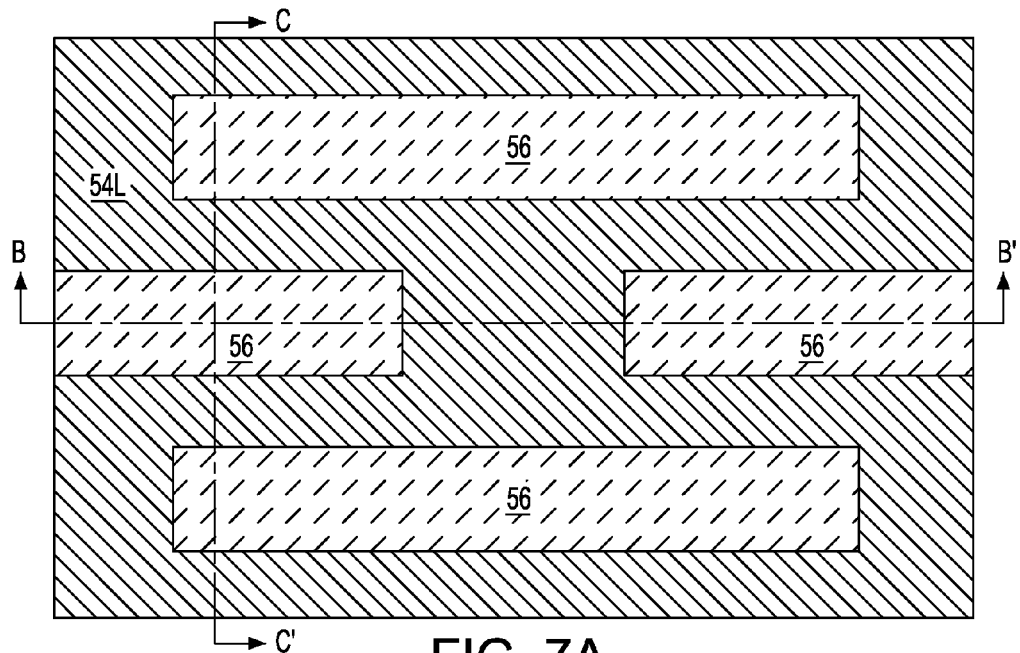
FIG. 7A is a top-down view of the first exemplary semiconductor structure of FIGS. 5A-5C after forming a cut mask comprising a photoresist layer having a pattern of openings over the fin-defining mask structures, the conductive material cap portions and the buried insulator layer.
Figure 7B:
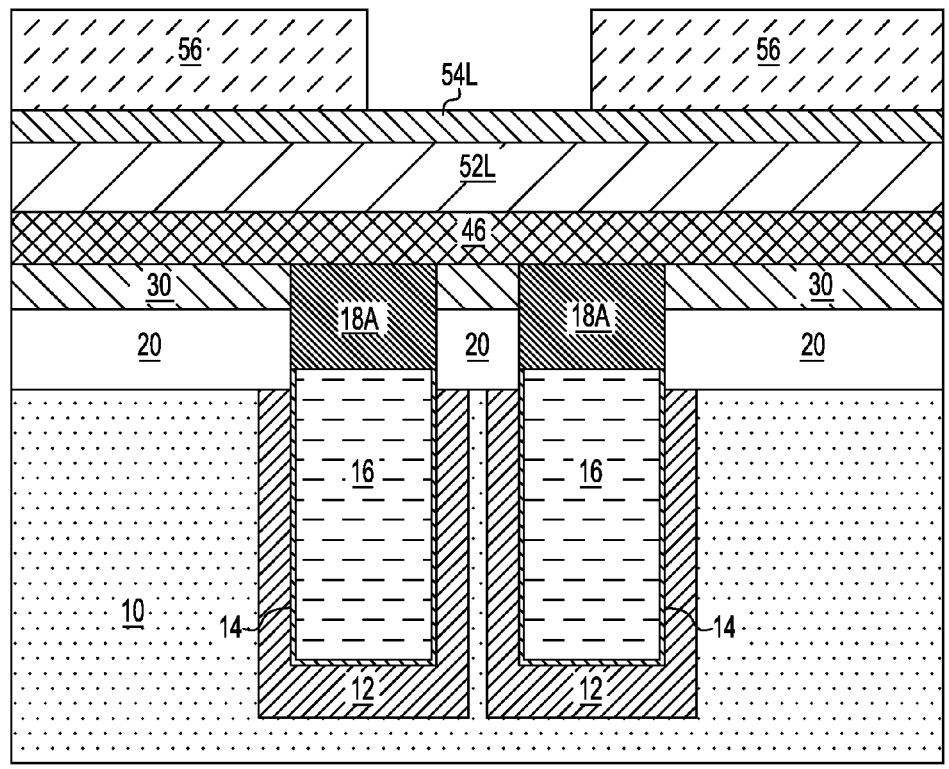
FIG. 7B is a cross-sectional view of the first exemplary semiconductor structure of FIG. 7A along the vertical plane B-B'.
Figure 7C:
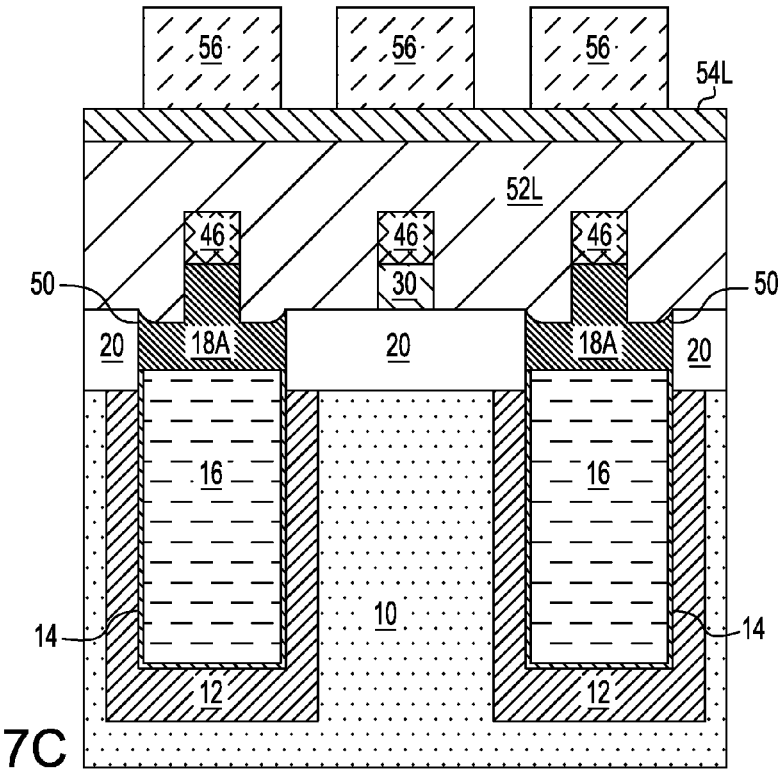
FIG. 7C is a cross-sectional view of the first exemplary semiconductor structure of FIG. 7A along the vertical plane C-C'.

Referring to FIGS. 7A-7C, a cut mask is applied over the fin-defining mask structures 46, the conductive material cap portions 18A and the buried insulator layer 20. The cut mask functions to remove unnecessary features formed in the previous fin-defining step which leads to the formation of the semiconductor layer portion 30. The cut mask may include a material stack of, from bottom to top, an organic planarization layer (OPL) 52L, an antireflective coating (ARC) layer 54L and a photoresist layer (not shown).

The OPL 52L may include a self-planarizing organic material which can be polyacrylate resin, epoxy resin, phenol resin, polyamide resin, polyimide resin, unsaturated polyester resin, polyphenylenether resin, or polyphenylene sulfide resin. The OPL 52L can be applied over the over the fin-defining mask structure 46, the conductive material cap portions 18A and the buried insulator layer 20, for example, by spin-coating. The OPL 52L that is formed thus completely fills the recessed areas 48 and has a top surface located above the top surface of fin-defining mask structure 46. The thickness of the OPL 52L can be from 100 nm to 400 nm, although lesser and greater thicknesses can also be employed.

The ARC layer 54L can include any antireflective material known in the art, such as, for example, a silicon-containing organic material. The ARC layer 54L can be formed, for example, by spin coating. The thickness of the ARC layer 54L that is formed can be from 10 nm to 150 nm, although lesser and greater thicknesses can also be employed.

The photoresist layer can be a layer of a photoresist sensitive to deep-ultraviolet (DUV) radiation, extreme ultraviolet (EUV), or mid-ultraviolet (MUV) radiation as known in the art, or can be an e-beam resist that is sensitive to radiation of energetic electrons. The photoresist layer can be formed, for example, by spin coating. The thickness of the photoresist layer that is formed can be from 100 nm to 600 nm, although lesser and greater thicknesses can also be employed.

The photoresist layer is lithographically patterned to form a pattern of openings therein. The openings overlie unwanted dummy fins to be cut (i.e., removed). The remaining portions of the photoresist layer are herein referred to as photoresist layer portions 56. A portion of each photoresist layer portion 56 can overlie a portion of a semiconductor layer portion 30 and a portion of a conductive material cap portion 18A which laterally contacts the portion of the semiconductor layer portion 30. In one embodiment, a photoresist layer portion 56 can overlie a pair of conductive material cap portions 18A.

Figure 8A:
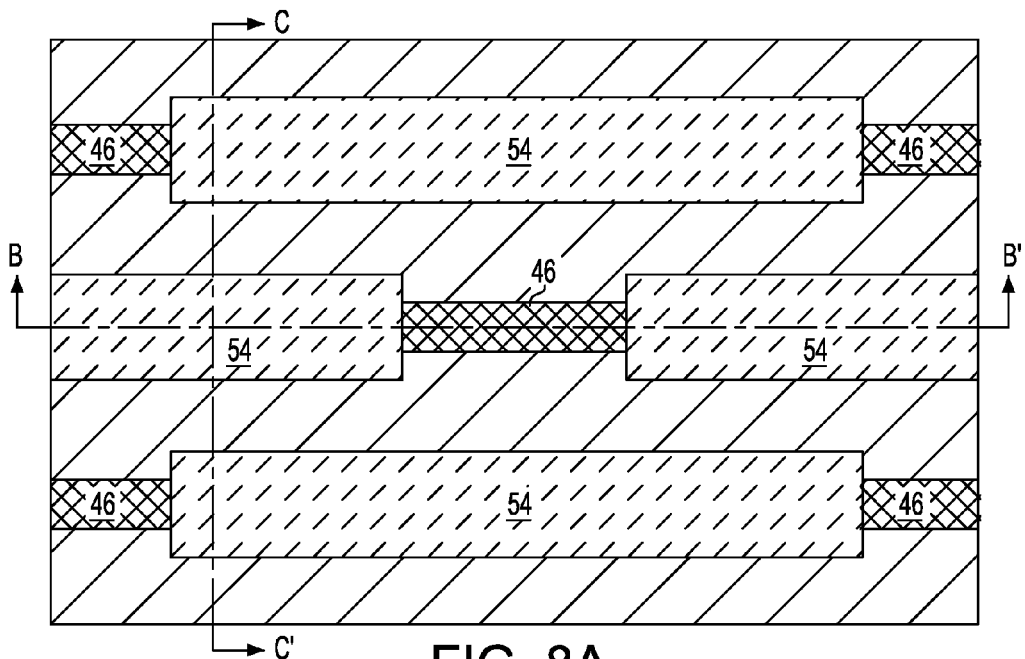
FIG. 8A is a top-down view of the first exemplary semiconductor structure of FIGS. 7A-7C after transferring the pattern of openings in the photoresist layer into a silicon-containing antireflective coating (SiARC) layer and an organic planarization layer (OPL) in the cut mask.
Figure 8B:
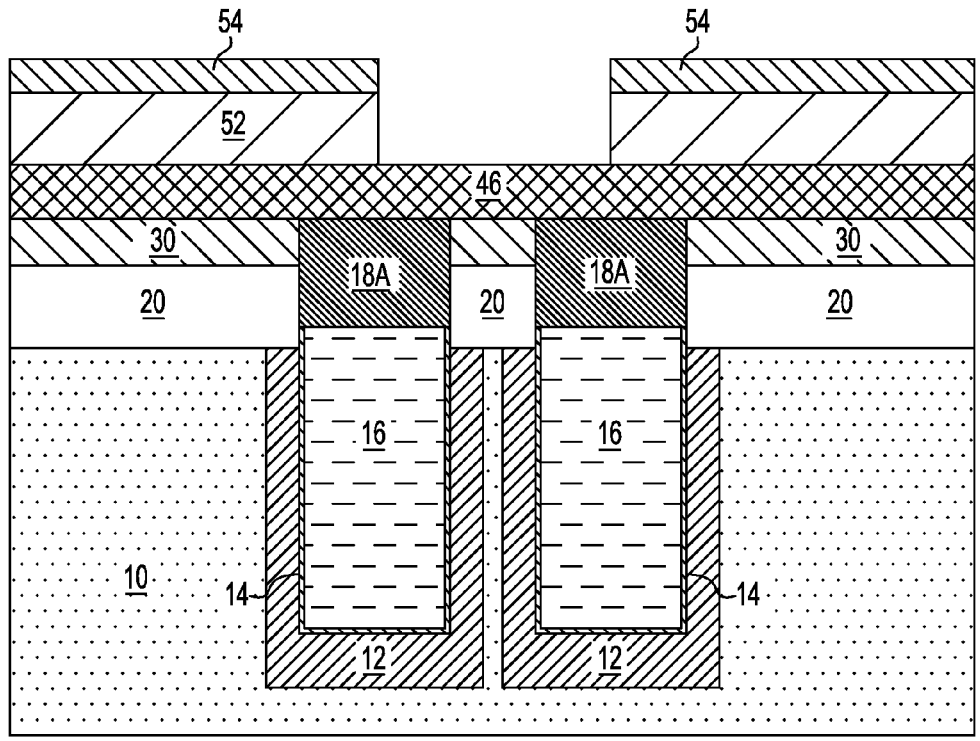
FIG. 8B is a cross-sectional view of the first exemplary semiconductor structure of FIG. 8A along the vertical plane B-B'.
Figure 8C:
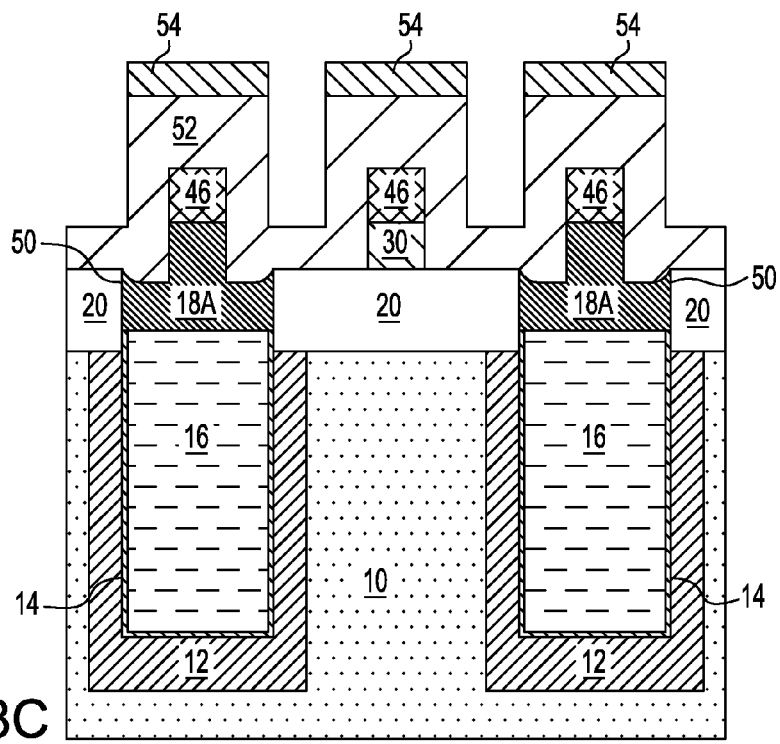
FIG. 8C is a cross-sectional view of the first exemplary semiconductor structure of FIG. 8A along the vertical plane C-C'.

Referring to FIGS. 8A-8C, the pattern of openings in the photoresist layer is transferred into the SiARC layer 54L and the OPL 52L by at least one anisotropic etch. In one embodiment, the SiARC layer 54L may be etched by a dry etch employing a fluorocarbon-containing plasma, and the OPL 52L may be etched employing an oxygen-containing plasma. The photoresist layer portions 56 acts as an etch mask for the etch of the SiARC layer 54L, and may be removed during the etch of the OPL 52L or by the end of OPL 52L patterning. The OPL 52L etch could be a full OPL etch or partial OPL etch as long as at least portions of the fin-defining mask structures 46 are exposed. The remaining portions of the SiARC layer 54L are herein referred to the SiARC layer portions 54. The remaining portions of the OPL 52L are herein referred to the OPL portions 52.

Figure 9A:
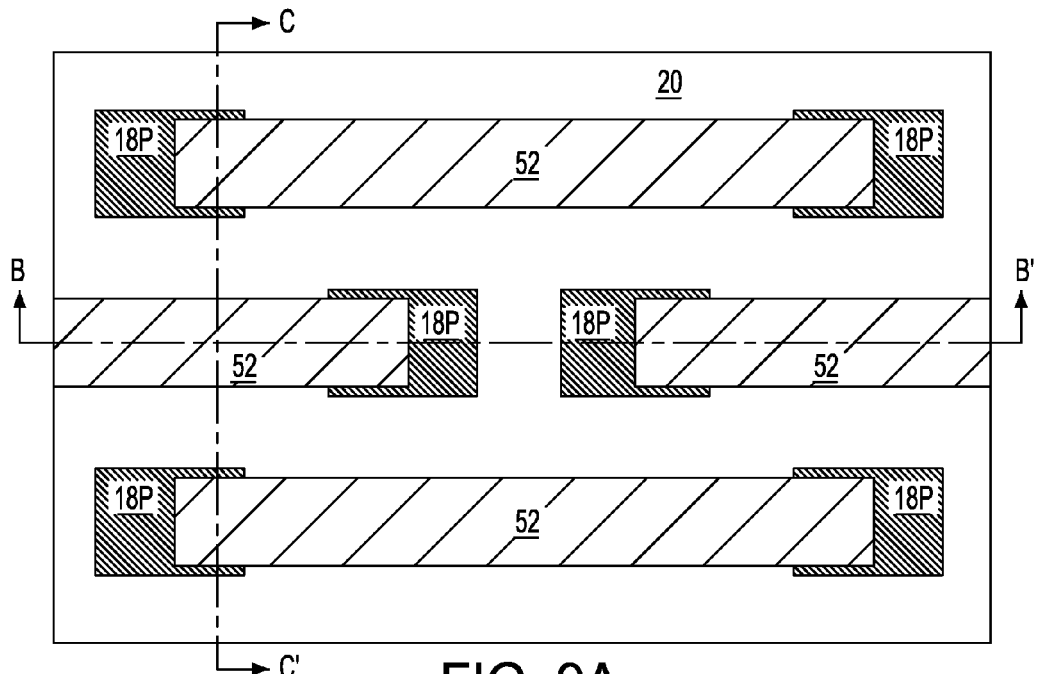
FIG. 9A is a top-down view of the first exemplary semiconductor structure of FIGS. 8A-8C after removing portions of the fin-defining mask structures and the underlying unwanted portions of the semiconductor layer portions and portions of the conductive material cap portions adjoined the unwanted portions of the semiconductor layer portions.
Figure 9B:
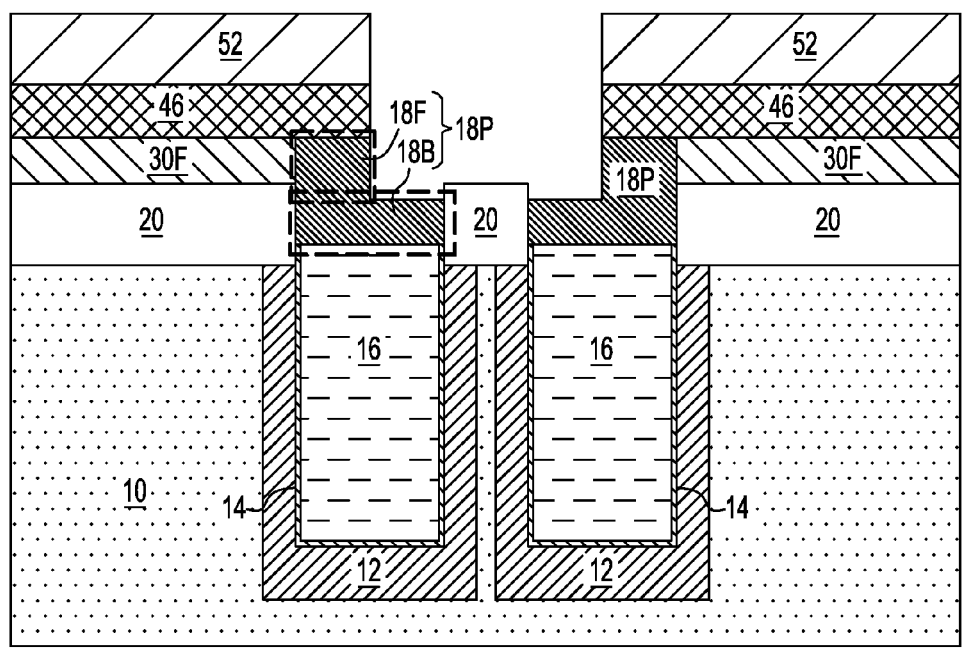
FIG. 9B is a cross-sectional view of the first exemplary semiconductor structure of FIG. 9A along the vertical plane B-B'.
Figure 9C:
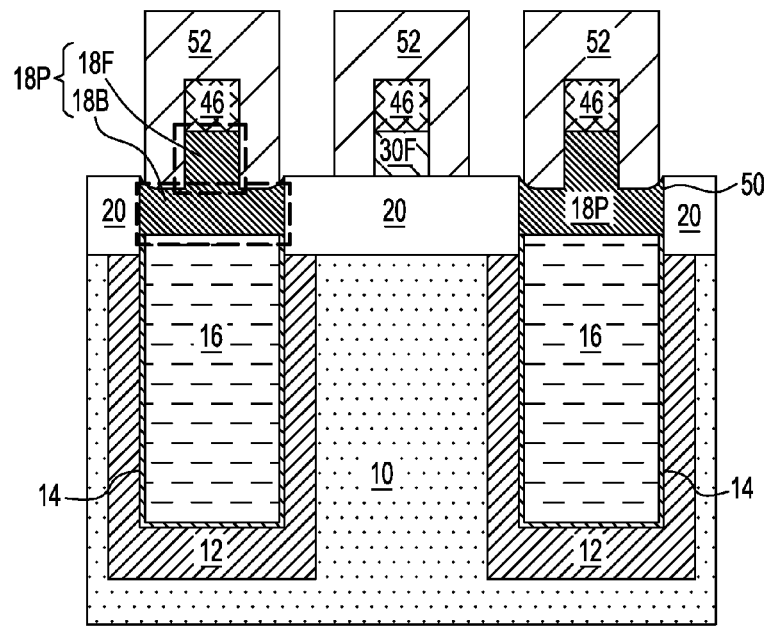
FIG. 9C is a cross-sectional view of the first exemplary semiconductor structure of FIG. 9A along the vertical plane C-C'.

Referring to FIGS. 9A-9C, portions of the fin-defining mask structures 46 and the underlying unwanted portions of the semiconductor layer portions 30 and portions of the conductive material cap portions 18A that adjoin the unwanted portions of the semiconductor layer portions 30 that are not covered by the SiARC layer portions 54 and the OPL portions 52 are removed. An anisotropic etch, which can be a dry etch or a wet chemical etch, may be performed to remove the materials of the fin-defining mask structures 46, the semiconductor layer portions 30 and the conductive material cap portions 18A selective to materials of the buried insulator layer 20. The SiARC layer portions 54 may also be removed during the removal of the exposed portions of the semiconductor fins 30F and conductive material cap portions 18A. The remaining portions of the semiconductor layer portions 30 are herein referred to as semiconductor fins 30F. The remaining portions of conductive material cap portions 18A are herein referred to as patterned conductive material cap portions 18P. Each patterned conductive material cap portion 18P includes a fin portion 18F laterally contacting a semiconductor fin 30F and a sidewall of the buried insulator layer 20 and a base portion 18B that underlies the fin portion 18F vertically contacting the inner electrode 16.

The anisotropic etch may be continued to remove portions of the OPL portions 52 from the recessed areas 48 to expose portions of the base portions 18B of the patterned conductive material cap portions 18P proximal to the sidewalls of the deep trenches 40. The conductive material spikes 50 are thus exposed. The semiconductor fins 18F and the fin portions 18F of the patterned conductive material cap portions 18P remain covered by the OPL portions 52.

Figure 10A:
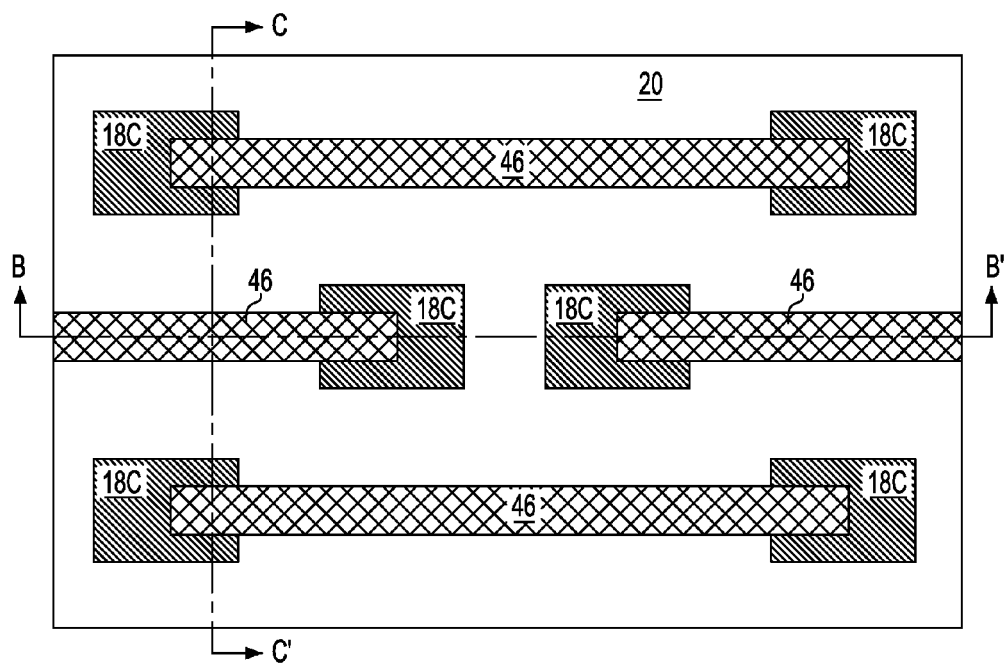
FIG. 10A is a top-down view of the first exemplary semiconductor structure of FIGS. 9A-9C after removing conductive material spikes in the conductive material cap portions from the sidewalls of the deep trenches to provide conductive strap structures and cavities above the conductive strap structures in the deep trenches.
Figure 10B:
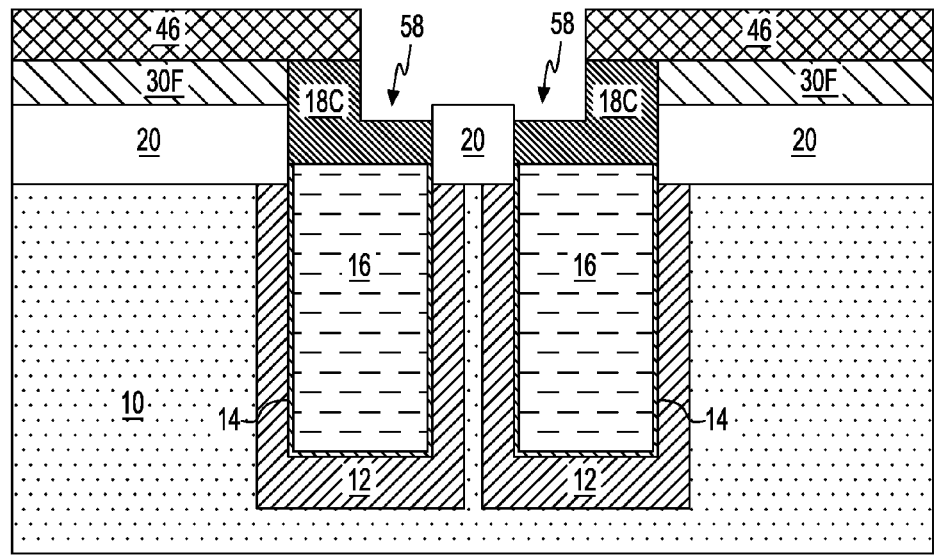
FIG. 10B is a cross-sectional view of the first exemplary semiconductor structure of FIG. 10A along the vertical plane B-B'.
Figure 10C:
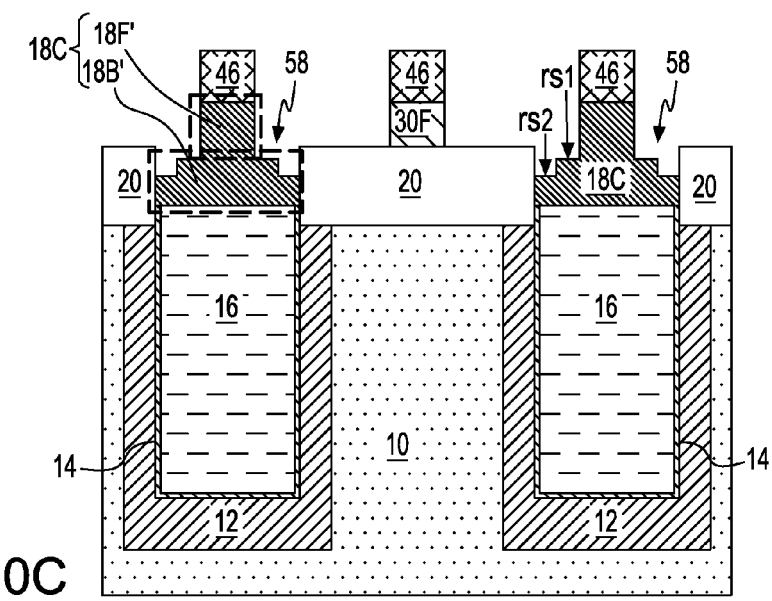
FIG. 10C is a cross-sectional view of the first exemplary semiconductor structure of FIG. 10A along the vertical plane C-C'.

Referring to FIGS. 10A-10C, the conductive material spikes 50 are removed from the sidewalls of the deep trenches 40 by an isotropic etch. The isotropic etch may be a wet chemical etch wet or a dry etch that removes the conductive material spikes 50 selective to OPL 52 and the buried insulator 20. In one embodiment, a fluorine containing plasma can be employed for the removal of the conductive material spikes 50. A spike-free deep trench sidewall surface is thus provided at an upper portion of each deep trench 40. The portions of the base portions 18B of the patterned conductive material cap portions 18P proximal to the sidewalls of the deep trenches 40 are also recessed by the isotropic etch, while the fin portions 18F of the patterned conductive material cap portions 18P that are covered by the OPL portions 52 remain intact although etching of the OPL portions 52 may occur during the isotropic etch. The remaining portion of each patterned conductive material cap portion 18P is herein referred to as a conductive strap structure 18C. This step provides a second recessed surface, $rs_2$, within the base portion of each conductive strap structure 18C which is deeper than the recessed surface, $rs_1$, thus forming conductive strap structure 18C having a stepped base portion 18B' and a fin portion 18F' extending from the stepped base portion 18B'. The fin portion 18F' laterally contacts a semiconductor fin 30F. In the stepped base portion 18B', a sidewall surface of the conductive strap structure 18C extends from the first recessed surface $rs_1$ to the second recessed surface $rs_2$. In another embodiment and when the conductive material spikes 50 are removed or are not present from prior patterning, the second recessed surface $rs_2$ would be at the same level as the recessed surface $rs_1$.

Upon formation of the conductive strap structures 18C, remaining portions of the OPL portions 52 are removed. In one embodiment, the remaining OPL portions 52 may be removed by, for example, plasma stripping or a wet chemical etch. A cavity 58 is thus is formed above the conductive strap structure 18C within each deep trenches 40.

In the present application and because the semiconductor fins 30F remain protected by the OPL portions 52 during the removal of the conductive material spikes 50 from the sidewalls of the deep trenches 40, the profile and dimensions of semiconductor fins 30F are preserved. In addition, because no separate mask is needed in the removal of the conductive material spikes 50, the approach of the present application allows reducing the number of masks and simplification of the manufacturing processes, thereby saving material and cost.

Figure 11A:
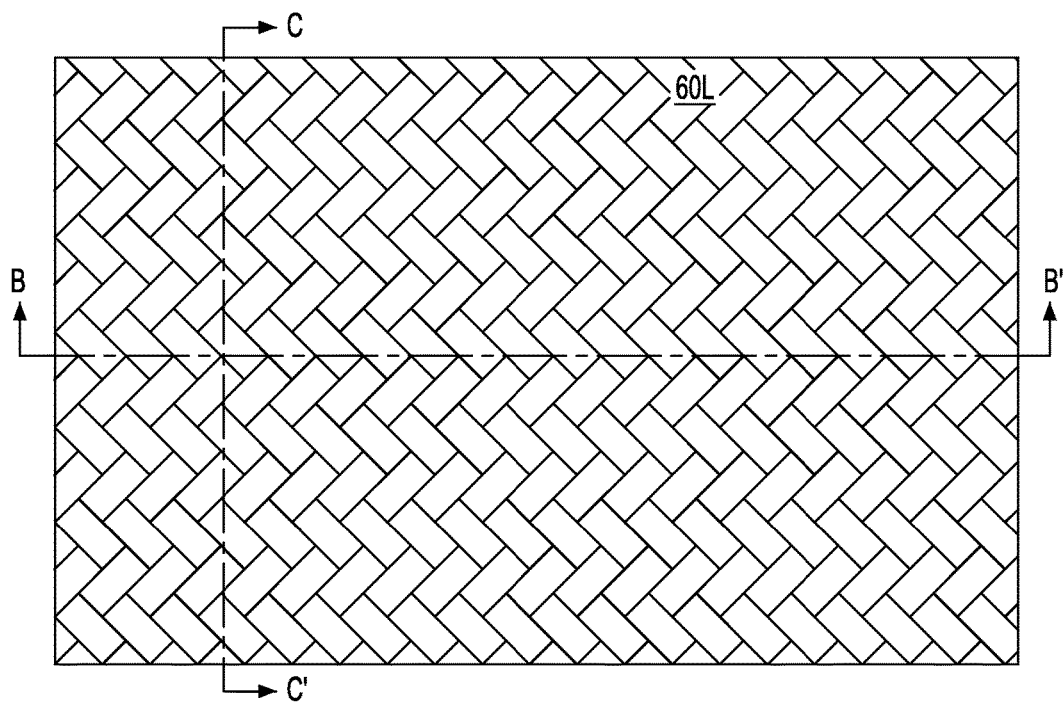
FIG. 11A is a top-down view of the first exemplary semiconductor structure of FIGS. 10A-10C after depositing a dielectric cap layer over the conductive strap structures, the fin-defining mask structures and the buried insulator layer.
Figure 11B:
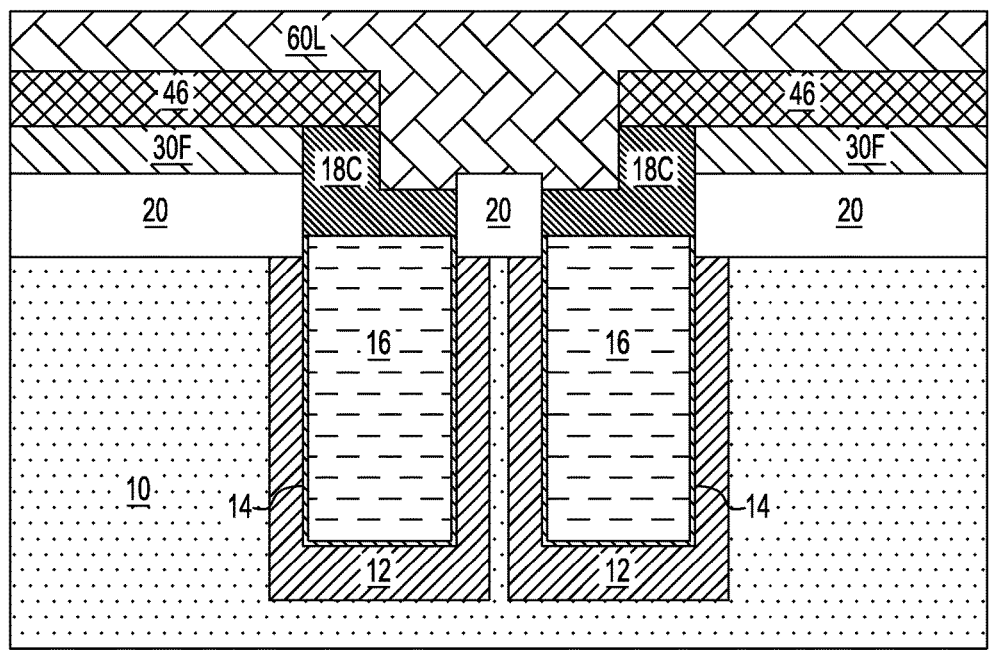
FIG. 11B is a cross-sectional view of the first exemplary semiconductor structure of FIG. 11A along the vertical plane B-B'.
Figure 11C:
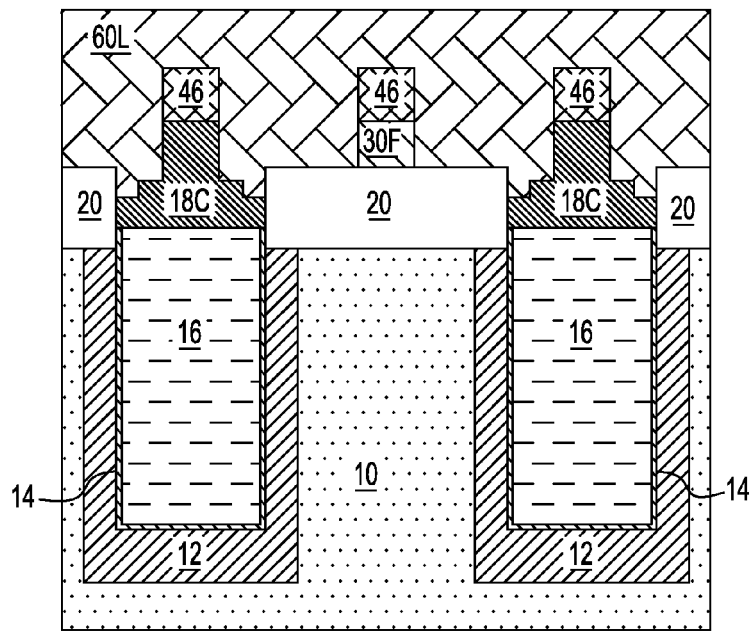
FIG. 11C is a cross-sectional view of the first exemplary semiconductor structure of FIG. 11A along the vertical plane C-C'.

Referring to FIGS. 11A-11C, a dielectric cap layer 60L is deposited in the cavities 58 and over the buried insulator layer 20 and the fin-defining mask structures 46. The dielectric cap layer 60L may include a dielectric oxide such as silicon dioxide, or a rare earth oxide. The dielectric cap layer 60L can be deposited, for example, by CVD or PECVD to a thickness to completely fill the cavities 58 within the deep trenches 40. A top surface of the dielectric cap layer 60L is located above the top surface of the fin-defining mask structures 46. In some embodiments of the present application, prior to the deposition of the dielectric cap layer 60L, a bilayer liner including a layer of silicon dioxide and an overlying layer of silicon nitride may be deposited on exposed surfaces of the cavities 58 to protect the semiconductor fins 30F.

Figure 12A:
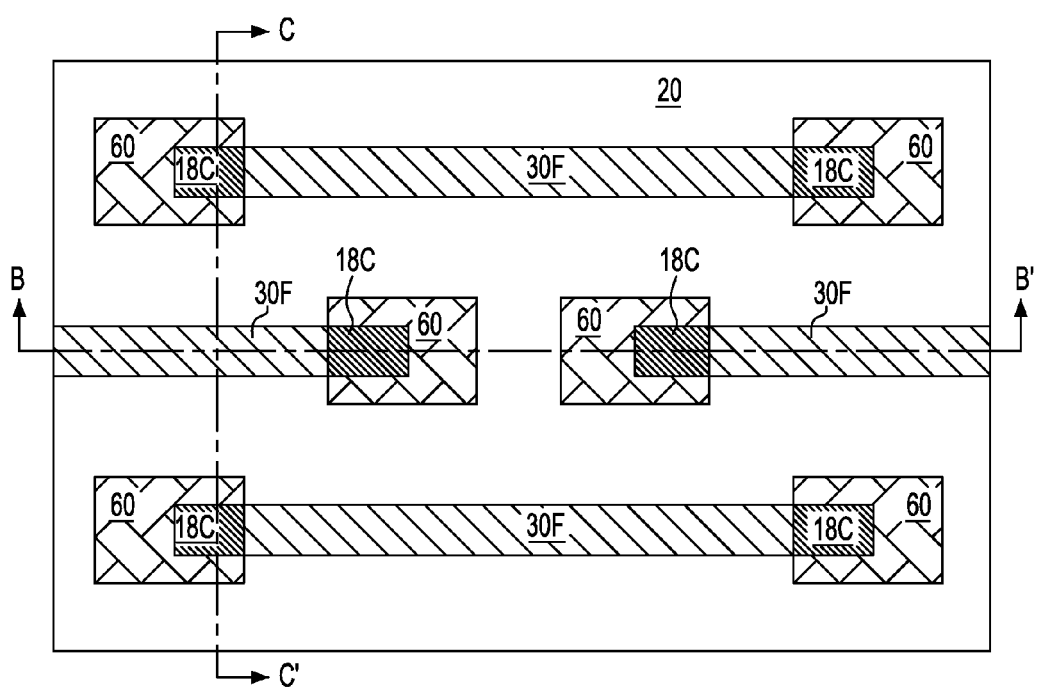
FIG. 12A is a top-down view of the first exemplary semiconductor structure of FIGS. 11A-11C after forming dielectric caps in the cavities.
Figure 12B:
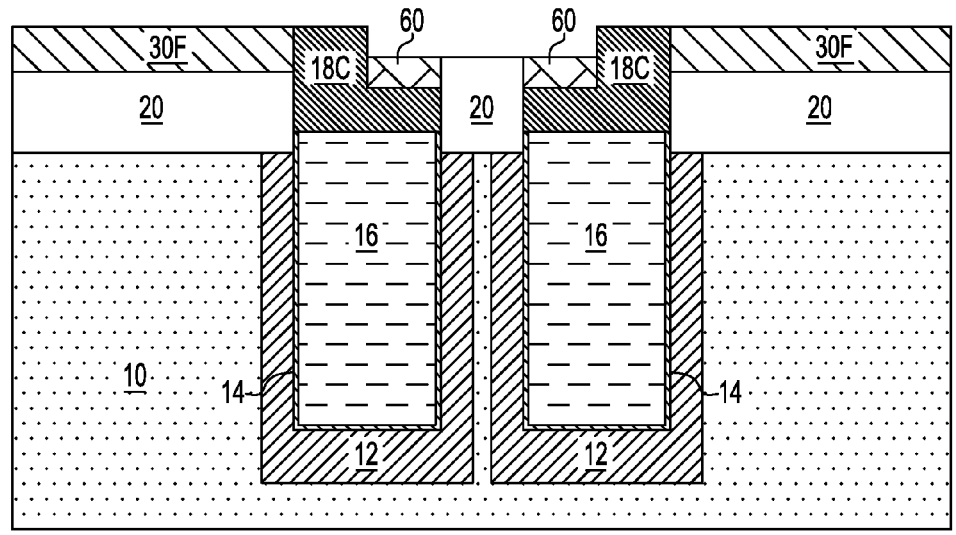
FIG. 12B is a cross-sectional view of the first exemplary semiconductor structure of FIG. 12A along the vertical plane B-B'.
Figure 12C:
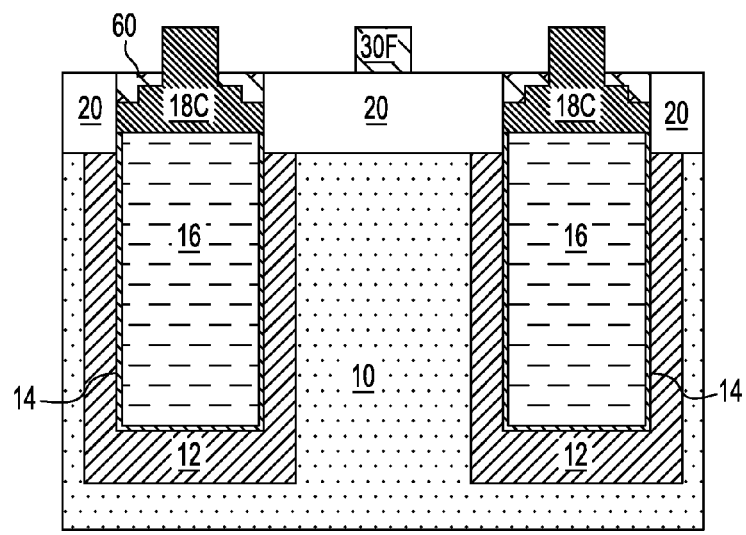
FIG. 12C is a cross-sectional view of the first exemplary semiconductor structure of FIG. 12A along the vertical plane C-C'.

Referring to FIGS. 12A-12C, dielectric caps 60 are formed in the cavities 58. The dielectric cap layer 60L is first recessed by an etch back process till the top surfaces of the fin-defining mask structures 46 are exposed. The etch back process can be CMP, RIE or a combination thereof. The fin-defining mask structures 46 may be partially removed by the etch back process employed to recess the dielectric cap layer 60L Subsequently, the fin-defining mask structures 46 are completely removed from the top of semiconductor fins 30F by an etch, which can be a wet chemical etch or a dry etch. In one embodiment and when each of buried insulator layer 20 and the dielectric cap layer 60L is composed of silicon dioxide and the fin-defining mask structures 46 are composed of silicon nitride, a wet chemical etch employing hot phosphoric acid can be employed to remove the fin-defining mask structures 46 from the top of the semiconductor fins 30F. After the removal of the fin-defining mask structures 46, the dielectric cap layer 60L is further recessed to provide the dielectric cap 60. The topmost surface of each dielectric cap 60 is coplanar with the top surface of the buried insulator layer 20.

Each dielectric cap 60 thus formed vertically contacts a stepped base portion 18B' and laterally surrounding a portion of the fin portion 18F' of a conductive strap structure 18C. The entirety of sidewalls of the dielectric cap 60 is vertically coincident with the entirety of sidewalls of the conductive strap structure 18C.

Figure 13A:
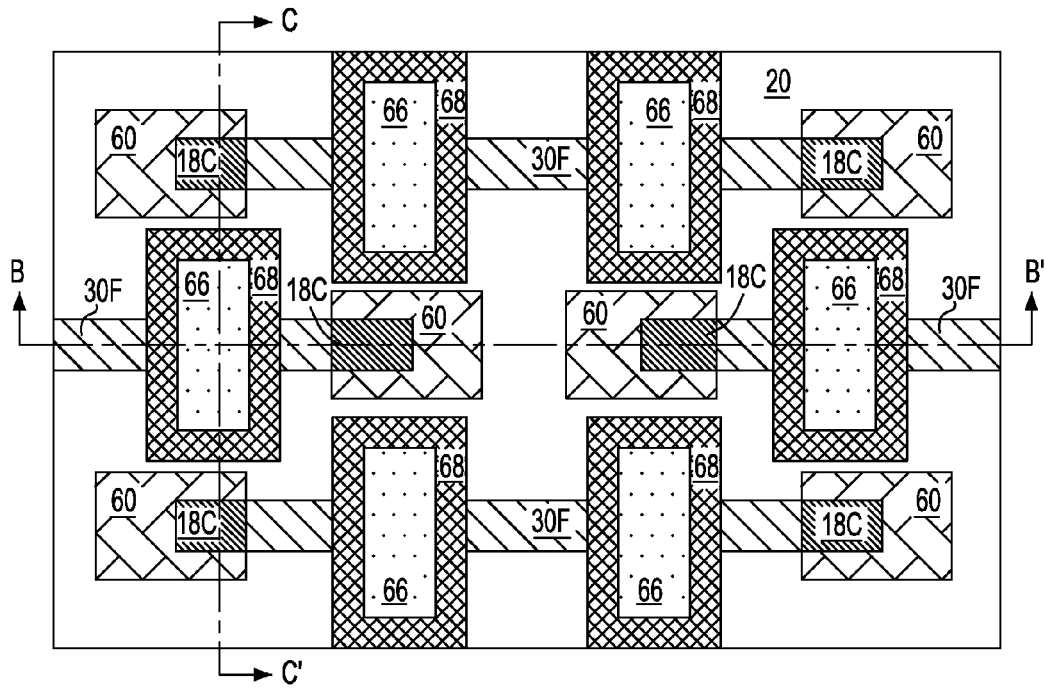
FIG. 13A is a top-down view of the first exemplary semiconductor structure of FIGS. 12A-12C after forming at least one gate structure over a portion of each semiconductor fin.
Figure 13B:
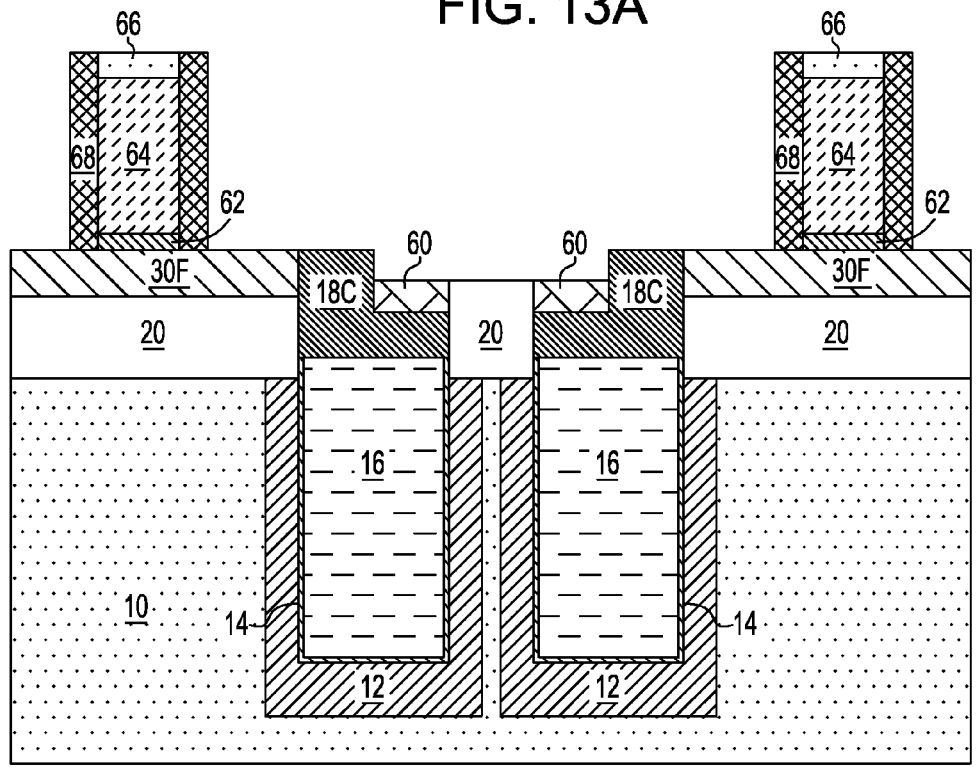
FIG. 13B is a cross-sectional view of the first exemplary semiconductor structure of FIG. 13A along the vertical plane B-B'.
Figure 13C:
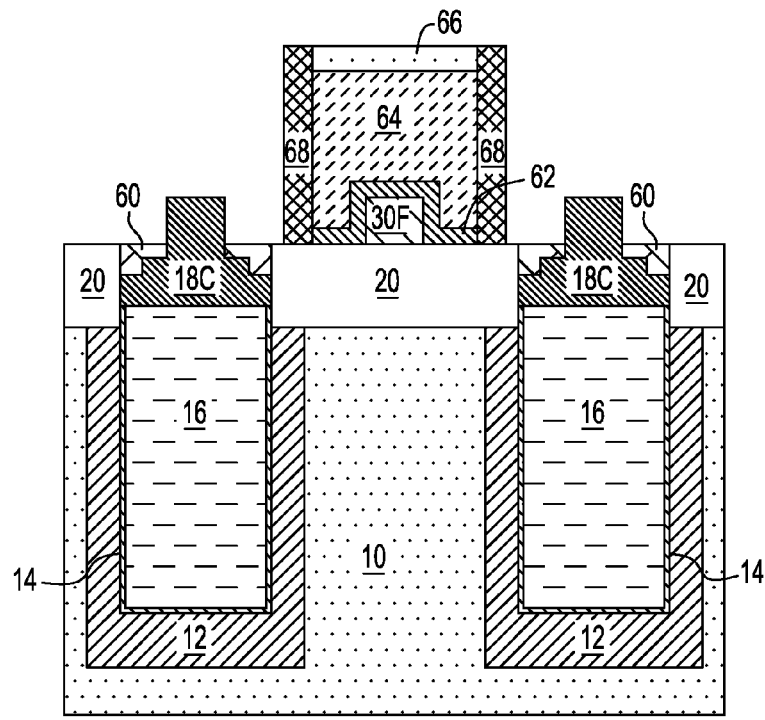
FIG. 13C is a cross-sectional view of the first exemplary semiconductor structure of FIG. 13A along the vertical plane C-C'.

Referring to FIGS. 13A-13C, gate structures are formed overlying portions of the semiconductor fins 30F. Each gate structure includes a gate stack straddling over a portion of a semiconductor fin 30F and a gate spacer 68 formed on each sidewall of the gate stack. In one embodiment and as shown in FIG. 13A, two gate stacks can straddle two parallel portions of one semiconductor fin 30F. The gate stack includes, from bottom to top, a gate dielectric 62, a gate electrode 64 and a gate cap 66. The gate stacks (62, 64, 66) may be formed by first providing a gate material stack (not shown) that includes, from bottom to top, a gate dielectric layer, a gate electrode layer and a gate cap layer over the semiconductor fins 30F, the conductive strap structures 18C, the dielectric aps 60 and the buried insulator layer 20.

The gate dielectric layer can be formed by converting surface portions of the semiconductor fins 30F into a dielectric semiconductor-containing material such as a dielectric semiconductor oxide, a dielectric semiconductor nitride, a dielectric semiconductor oxynitride, or a combination thereof. For example, if the semiconductor fins 30F include silicon, the dielectric semiconductor-containing material can be silicon dioxide, silicon nitride, silicon oxynitride, or a combination thereof. The thickness of the gate dielectric layer can be, for example, from 0.5 nm to 6 nm, although lesser and greater thicknesses can also be employed. Alternately or additionally, the gate dielectric layer can be formed by depositing a dielectric material. In one embodiment, the material of the gate dielectric layer can be deposited by a conformal deposition method such as ALD or CVD. In one embodiment, the deposited dielectric material can include a dielectric semiconductor oxide such as silicon dioxide. In another embodiment, the deposited dielectric material can include a dielectric metal oxide, a dielectric metal nitride, and/or a dielectric metal oxynitride. In one embodiment, the deposited dielectric material can include a high-dielectric constant (high-k) gate dielectric material known in the art. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

The gate electrode layer includes a conductive material, which can include a doped semiconductor material such as doped polysilicon, a metallic material such as Al, Au, Ag, Cu or W, or combinations thereof. The gate electrode layer can be deposited, for example, by CVD, PVD, or any other known method for depositing a conductive material. The thickness of the gate electrode layer, as measured in planar regions, can be from 20 nm to 300 nm, although lesser and greater thicknesses can also be employed.

The dielectric gate cap layer includes a dielectric material such as silicon nitride, silicon dioxide, silicon oxynitride, and/or a dielectric metal oxide. The dielectric gate cap layer can be deposited, for example, by CVD. The thickness of the dielectric gate cap layer can be from 5 nm to 50 nm, although lesser and greater thicknesses can also be employed.

The gate material stack can then be patterned by lithography and etching to form the gate stacks (62, 64, 66). Specifically, a photoresist layer (not shown) is applied over the topmost surface of the gate material stack and is lithographically patterned by lithographic exposure and development. The pattern in the photoresist layer is transferred into the material stack by an etch, which can be an anisotropic etch such as RIE. The remaining portions of the material stack after the pattern transfer constitute the sacrificial gate stack (62, 64, 66). The patterned photoresist layer may be subsequently removed by, for example, ashing.

The gate spacer 68 may include a dielectric material such as, for example, an oxide, a nitride, an oxynitride, or any combination thereof. For example, the gate spacer 68 may be composed of silicon nitride, silicon boron carbon nitride, or silicon carbon oxynitride. The gate spacer 68 can be formed by first providing a conformal gate spacer material layer (not shown) on exposed surfaces of the gate stacks (62, 64, 66), the semiconductor fins 30F, the conductive strap structures 18C, the dielectric aps 60 and the buried insulator layer 20 and then etching the conformal gate spacer material layer to remove horizontal portions of the conformal gate spacer material layer. The conformal gate spacer material layer can be provided by a deposition process including, for example, CVD, PECVD, or PVD. The etching of the conformal gate spacer material layer may be performed by a dry etch process such as, for example, RIE. The remaining portions of the conformal gate spacer material layer constitute the gate spacer(s) 68. The width of each gate spacer 68, as measured at the base of the gate spacer 68 can be from 5 nm to 100 nm, although lesser and greater widths can also be employed.

In some embodiments of the present application, the gate stacks (62, 64, 66) are sacrificial gate stacks for a replacement gate process and can be replaced with functional gate stacks after the formation of the source/drain regions employing methods known in the art. The term "sacrificial gate stack" as used herein denotes a structure that serves as a placeholder for a functional gate stack to be subsequently formed. The term "functional gate stack" as used herein denotes a permanent gate stack used to control output current (i.e., flow of carriers in the channel) of a semiconducting device through electrical fields.

Figure 14A:
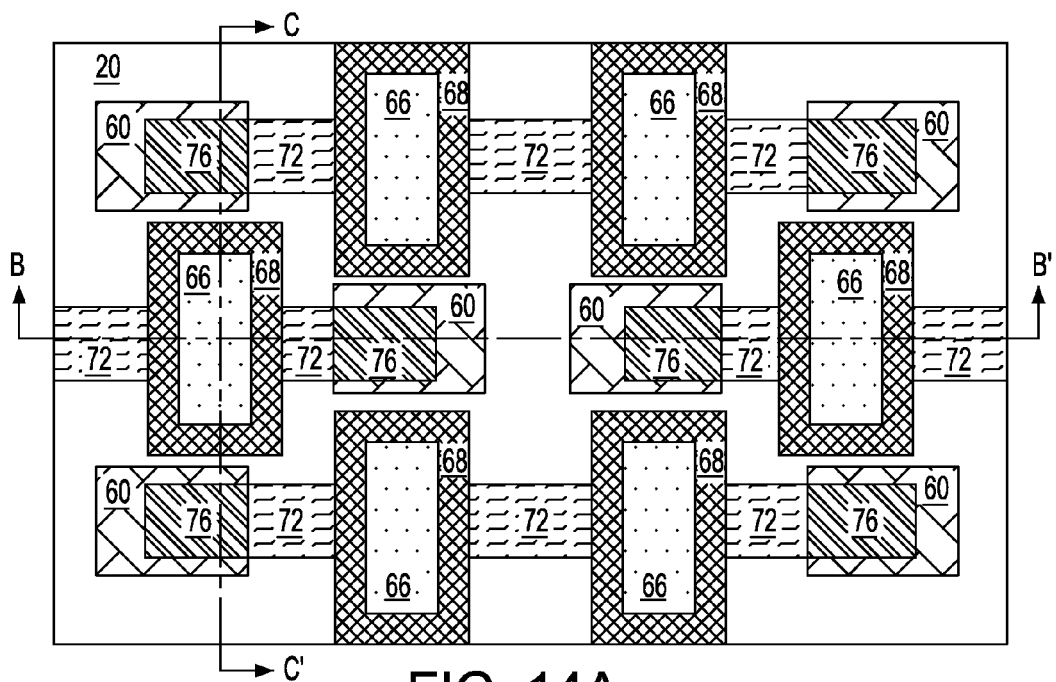
FIG. 14A is a top-down view of the first exemplary semiconductor structure of FIGS. 13A-13C after forming source/drain regions on portions of the semiconductor fins on opposite sides of the gate structures and outer conductive strap structures over the conductive strap structures.
Figure 14B:
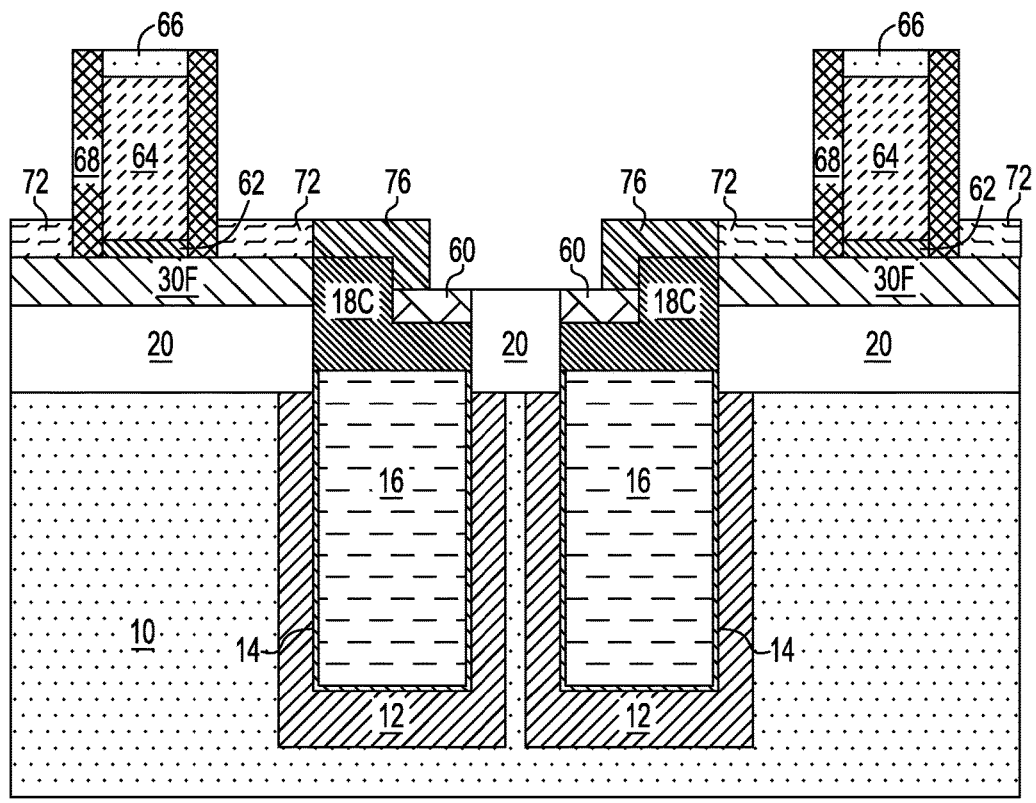
FIG. 14B is a cross-sectional view of the first exemplary semiconductor structure of FIG. 14A along the vertical plane B-B'.
Figure 14C:
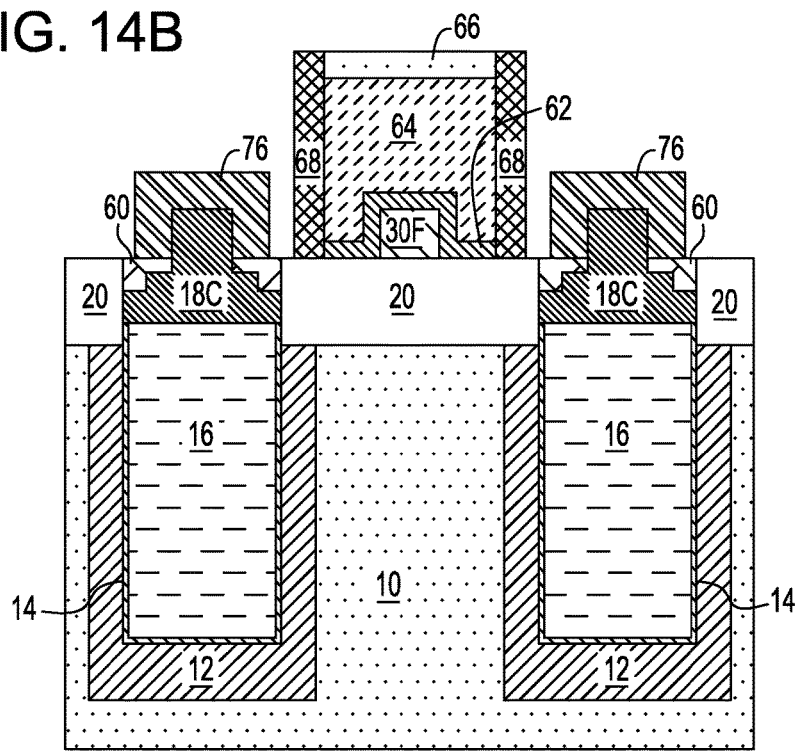
FIG. 14C is a cross-sectional view of the first exemplary semiconductor structure of FIG. 14A along the vertical plane C-C'.

Referring to FIGS. 14A-14C, a semiconductor material is selectively deposited on exposed surfaces of the semiconductor fins 30F and the conductive strap structures 18C to form a raised source region and a raised drain region (collectively referred to as raised source/drain regions 72) on portions of the semiconductor fins 30F located on opposite sides of each gate structure (62, 64, 66, 68) and an outer conductive strap structure 76 on each conductive strap structure 18C. In one embodiment and as shown in FIG. 13A, source/drain regions 72 between adjacent gate structures (62, 64, 66, 68) may be merged. Each outer conductive strap structure 76 contacts sidewalls and a top surface of a fin portion 18F' of a conductive strap structure 18C.

The semiconductor material of the raised source/drain regions 72 and the outer conductive strap structures 76 can be selected from, but are not limited to, silicon, silicon germanium, silicon carbon, silicon germanium carbon, a compound semiconductor material, or an alloy thereof. The deposition of the semiconductor material can be performed, for example, by a selective epitaxy process. During the selective deposition of the semiconductor material, the semiconductor material is deposited on semiconductor surfaces of the semiconductor fins 30F and the conductive strap structures 18C, but not on dielectric surfaces such as the surfaces of the gate caps 66, the gate spacers 68, the dielectric caps 60 and the buried insulator layer 20. In one embodiment, the raised source/drain regions 72 can be formed as a single crystalline semiconductor material portion that is in epitaxial alignment with a single crystalline semiconductor material of the semiconductor fins 30F. By "epitaxial alignment" it is meant that the raised source/drain regions 72 have a same crystal orientation as that of the underlying semiconductor fins 30F. The outer conductive strap structures 76 can be formed as polycrystalline semiconductor material portions. The thicknesses of the raised source/drain regions 72 and the outer conductive strap structures 76, as measured above a top surface of a semiconductor fin 30F or above a topmost surface of a contact strap structure 18C, can be from 1 nm to 50 nm, although lesser and greater thicknesses can also be employed. With the removal of the conductive spike 50, and covering the top of the trenches with dielectric caps 60, the deep trench shorting mechanisms through the raised source drain region 72 is eliminated.

The raised source/drain regions 72 and the outer conductive strap structures 76 are doped with n-type or p-type dopants. For nFinFETs, the source/drain regions 72 are doped n-type, while for pFinFETs, the source/drain regions 72 are doped p-type. The doping of the source/drain regions 72 and the outer conductive strap structures 76 can be formed in-situ during the epitaxial growth of the semiconductor material. Alternatively, the doping of the source/drain regions 72 and the outer conductive strap structures 76 can be formed after the epitaxial growth of the semiconductor material by ion implantation, gas phase doping or out diffusion of a dopant from a sacrificial material layer include said doping. Dopants in the source/drain regions 72 and the outer conductive strap structures 76 can be subsequently activated, for example, by laser anneal.

In the present application and because the epitaxial growth of the semiconductor material during the formation of source/drain regions 72 of FinFETs does not occur on dielectric surfaces of the dielectric cap 60, the presence of the dielectric cap 60 over the top of the base portion 18B' of the conductive strap structure 18C prevents the epitaxially grown semiconductor material in adjacent deep trenches 40 from touching each other, thus preventing the electrical shorts between the adjacent deep trench capacitors (12, 14, 16). In addition and in the case where the dielectric cap 60 is eroded at portion proximal to the sidewalls of the deep trench 40, the stepped structure of the base portion of the conductive strap structure 18C resulting from the removal of the conductive material spikes 50 from the sidewalls of the deep trench 40 makes the stepped base portion 18B' of the conductive strap structure 18C less likely to be exposed, thus further reducing the possibility and almost eliminating the electrical shorts between adjacent deep trench capacitors (12, 14, 16).

Figure 15A:
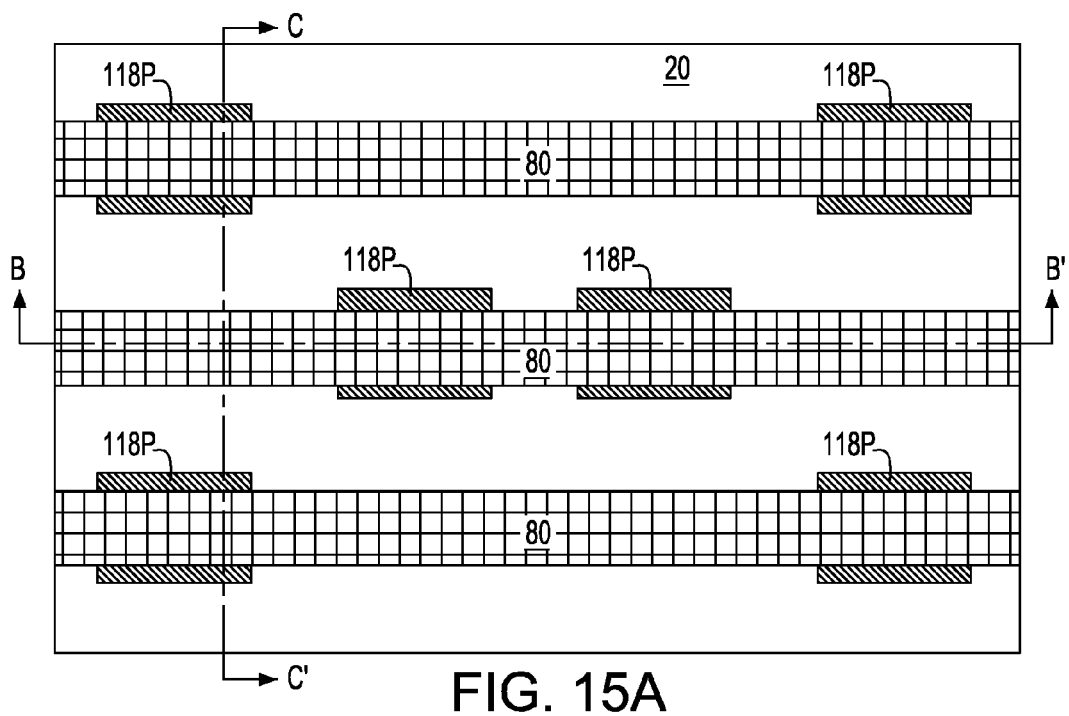
FIG. 15A is a top-down view of a variation of the first exemplary semiconductor structure that can be derived from the first exemplary semiconductor structure of FIGS. 5A-5C illustrating removal of the conductive material spikes during the fin-defining step by forming a patterned mask layer to expose portions of the base portions of conductive material cap portions proximal to the sidewalls of the deep trenches.
Figure 15B:
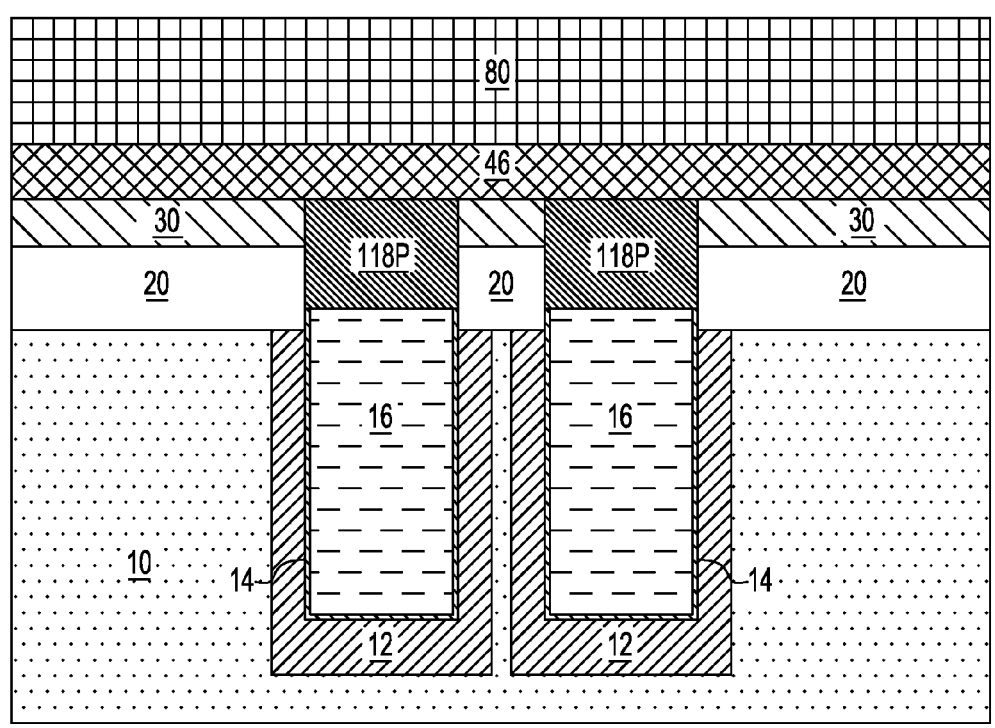
FIG. 15B is a cross-sectional view of the variation of the first exemplary semiconductor structure of FIG. 15A along the vertical plane B-B'.
Figure 15C:
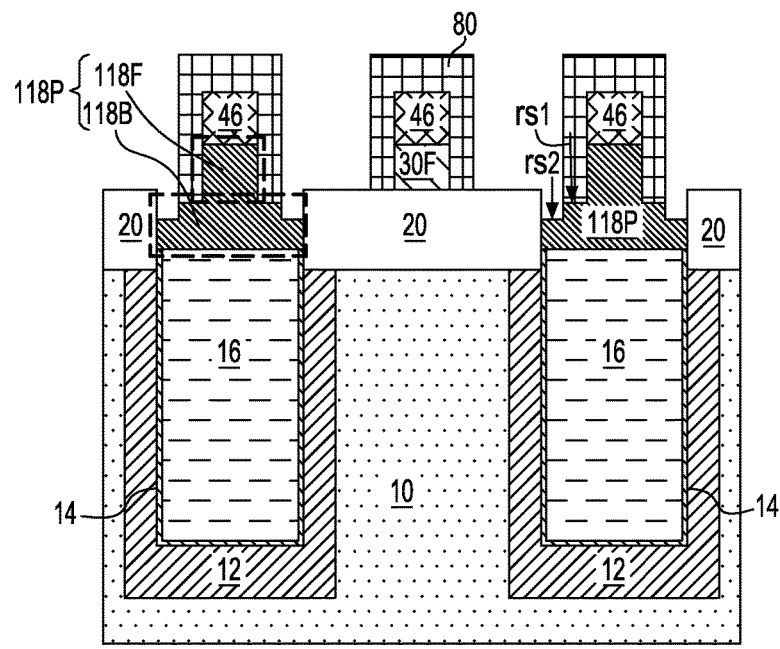
FIG. 15C is a cross-sectional view of the variation of the first exemplary semiconductor structure of FIG. 15A along the vertical plane C-C'.

Referring to FIGS. 15A-15C, a variation of the first exemplary semiconductor structure can be derived from the first exemplary semiconductor structure of FIGS. 5A-5C by removing the conductive material spikes 50 during the fin-defining step rather than the dummy fin cutting step. After the formation of the semiconductor layer portions 30 and the conductive material cap portions 18A, a mask layer 80 is applied over the fin-defining mask structures 46 and the buried insulator layer 20 and lithographically patterned to expose portions of base portions of conductive material cap portions 18A proximal to the sidewalls of the deep trenches 40. The conductive material spikes 50 are thus exposed. The mask layer 80 can be a photoresist layer or a photoresist layer in conjunction with hardmask layer(s).

The isotropic etch of FIGS. 10A-10C is performed to remove the conductive material spikes 50 from the sidewalls of the deep trenches 40. The remaining portions of the mask layer 80 that protect the semiconductor layer portions 30 during the isotropic etch can be subsequently removed by, for example, ashing. A patterned conductive material cap portion 118P is thus formed over the deep trench capacitor (14, 16, 18) in each deep trench 40. Each patterned conductive material cap portion 118P contains a stepped base portion 118B and a fin portion 118F extending from the stepped base portion 118B. The stepped base portion 118B has a first recessed surface $rs_1$ located below the top surface of the buried insulator layer 20 by a first depth and a second recessed surface $rs_2$ located below the top surface of the buried insulator layer 20 by a second depth which is greater than the first depth.

The processing steps of FIGS. 7A-7C, 8A-8C and 9A-9C are subsequently performed to remove portions of the unwanted semiconductor layer portions 30 and portions of the patterned conductive cap portions 118 adjoined to the unwanted semiconductor layer portions 30 to provide the semiconductor fins 30F and the conductive strap structures 18C.

Figure 16A:
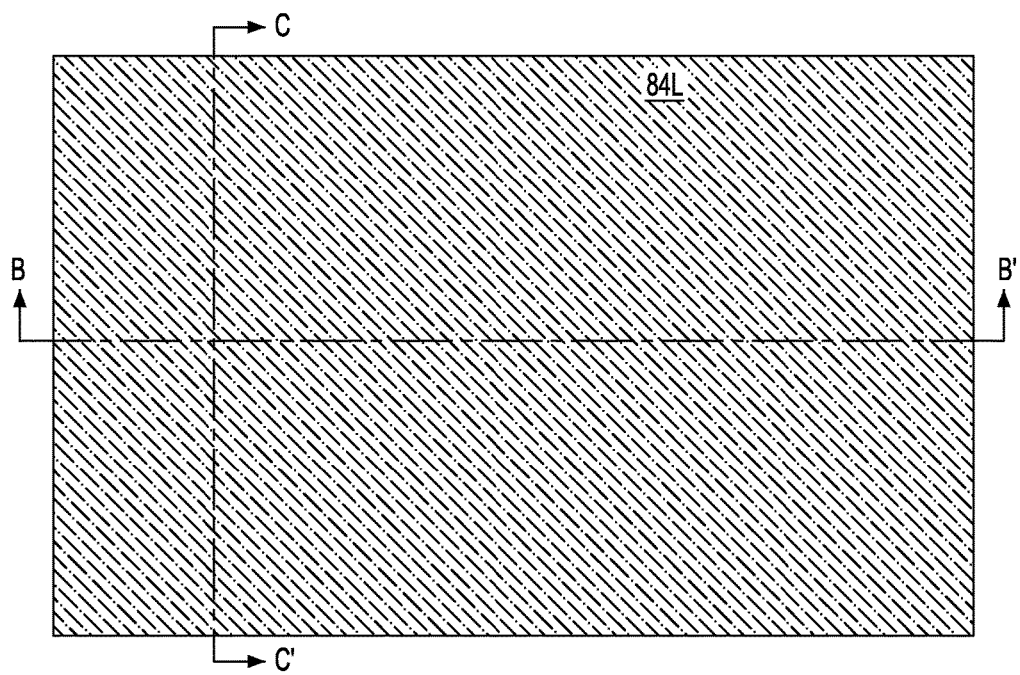
FIG. 16A is a top-down view of a second exemplary semiconductor structure that can be derived from the first exemplary semiconductor structure of FIGS. 10A-10C after depositing a dielectric oxide liner layer on exposed surfaces of the semiconductor fins, the conductive strap structures and buried insulator layer and a dielectric nitride liner layer on the dielectric oxide liner layer according to a second embodiment of the present application.
Figure 16B:
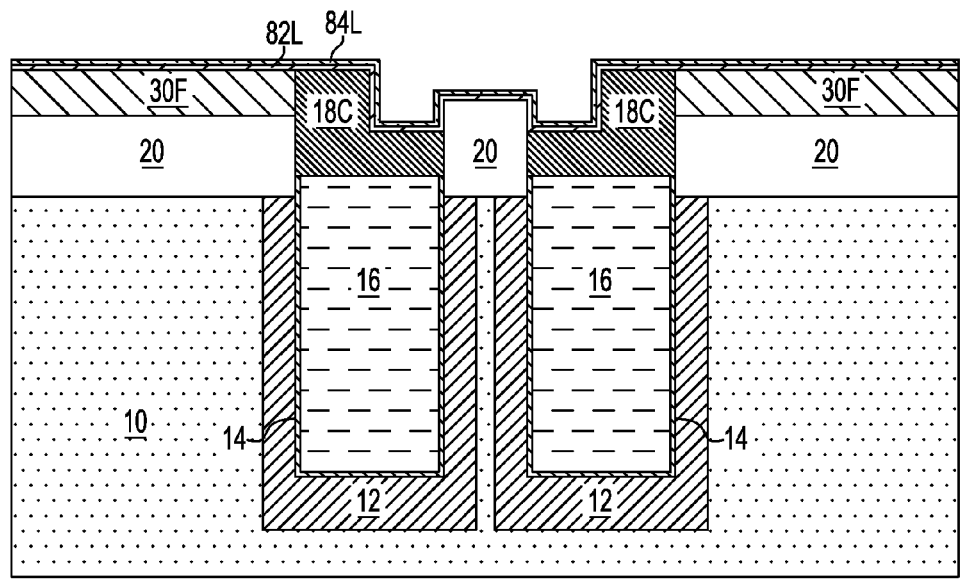
FIG. 16B is a cross-sectional view of the second exemplary semiconductor structure of FIG. 16A along the vertical plane B-B'.
Figure 16C:
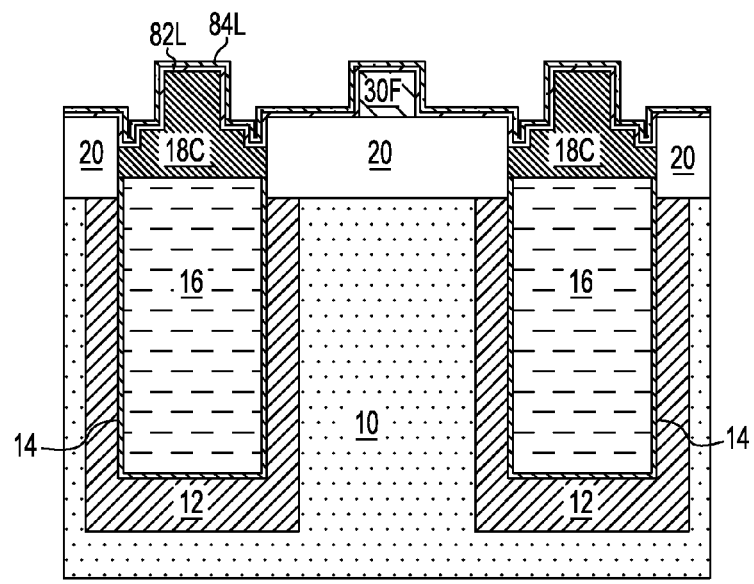
FIG. 16C is a cross-sectional view of the second exemplary semiconductor structure of FIG. 16A along the vertical plane C-C'.

Referring to FIGS. 16A-16C, a second exemplary semiconductor structure according to a second embodiment of the present application can be derived from the first exemplary semiconductor structure of FIGS. 10A-10C by depositing a dielectric oxide liner layer 82L on exposed surfaces of the semiconductor fins 30F, the conductive strap structures 18C and buried insulator layer 20 and a dielectric nitride liner layer 84L on the dielectric oxide liner layer 82L. The dielectric oxide liner layer 82L may include a silicon dioxide. The dielectric oxide liner layer 82L can be formed, for example, by CVD or PECVD. The dielectric oxide liner layer 82L that is formed can have a thickness from 5 nm to 10 nm, although lesser and greater thicknesses can also be employed. The dielectric nitride liner layer 84L may include silicon nitride. The dielectric nitride liner layer 84L can be formed, for example, by CVD or PECVD. The dielectric nitride liner layer 84L that is formed can have a thickness from 5 nm to 10 nm, although lesser and greater thicknesses can also be employed.

Figure 17A:
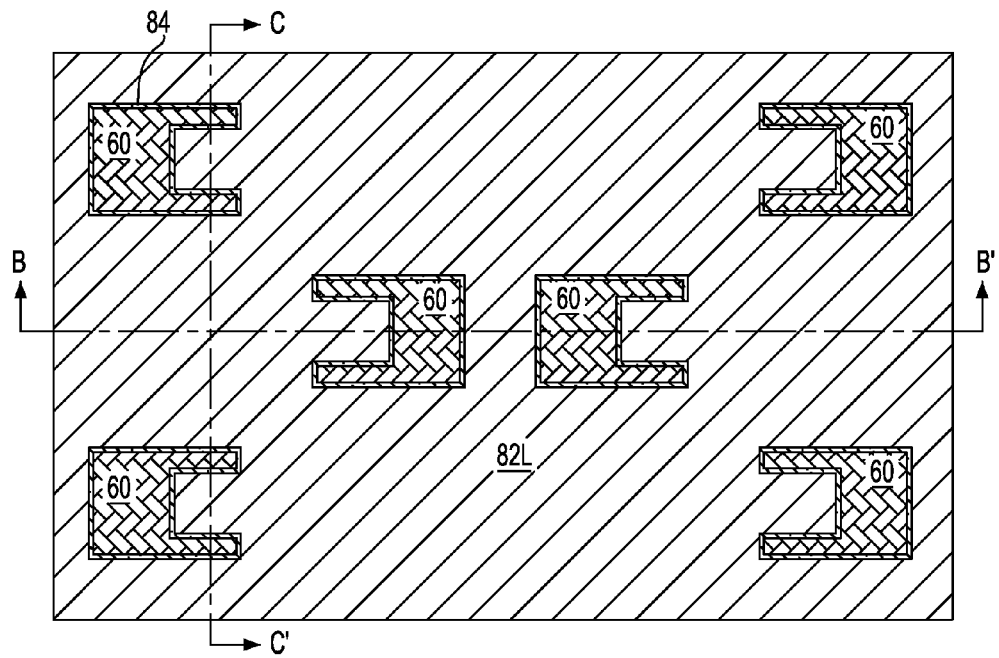
FIG. 17A is a top-down view of the second exemplary semiconductor structure of FIGS. 16A-16C after forming dielectric caps and dielectric nitride liners in the cavities.
Figure 17B:
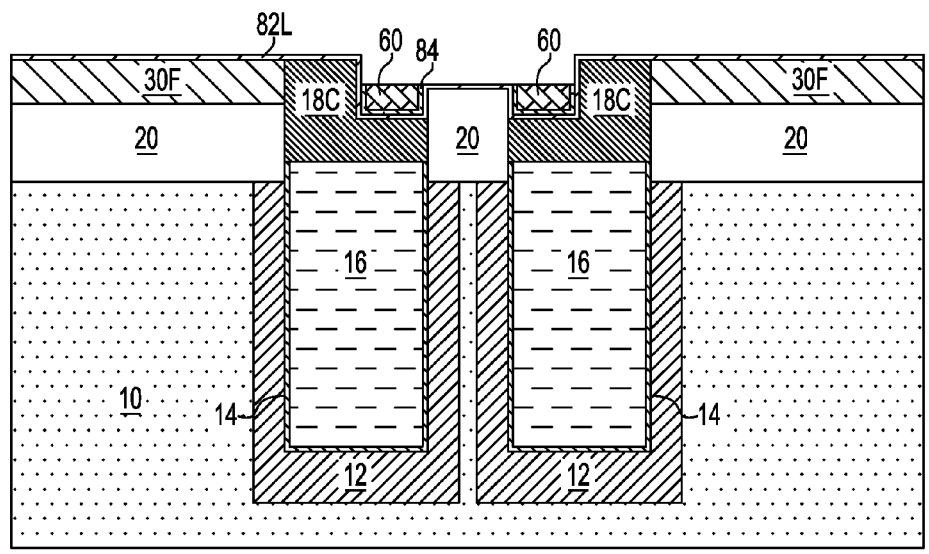
FIG. 17B is a cross-sectional view of the second exemplary semiconductor structure of FIG. 17A along the vertical plane B-B'.
Figure 17C:
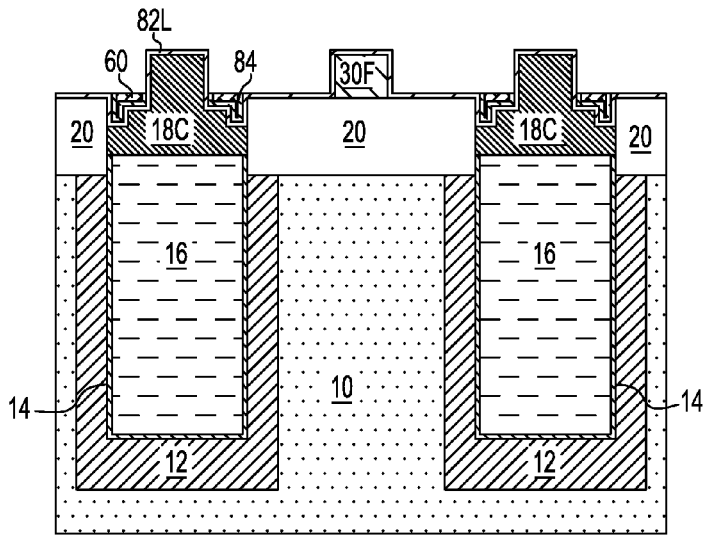
FIG. 17C is a cross-sectional view of the second exemplary semiconductor structure of FIG. 17A along the vertical plane C-C'.

Referring to FIGS. 17A-17C, the processing steps of FIGS. 11A-11C are performed to form a dielectric cap layer over the dielectric nitride liner layer 84L. The processing steps of FIGS. 12A-12C are performed to form dielectric caps 60 within the remaining volumes of the cavities 58. Subsequently, portions of the dielectric nitride liner layer 84L that are not covered by the dielectric caps 60 are removed by at least one etch which can be a dry etch or a wet chemical etch. Remaining portions of the dielectric nitride liner layer 84L within the deep trenches 40 constitute the dielectric nitride liners 84.

Figure 18A:
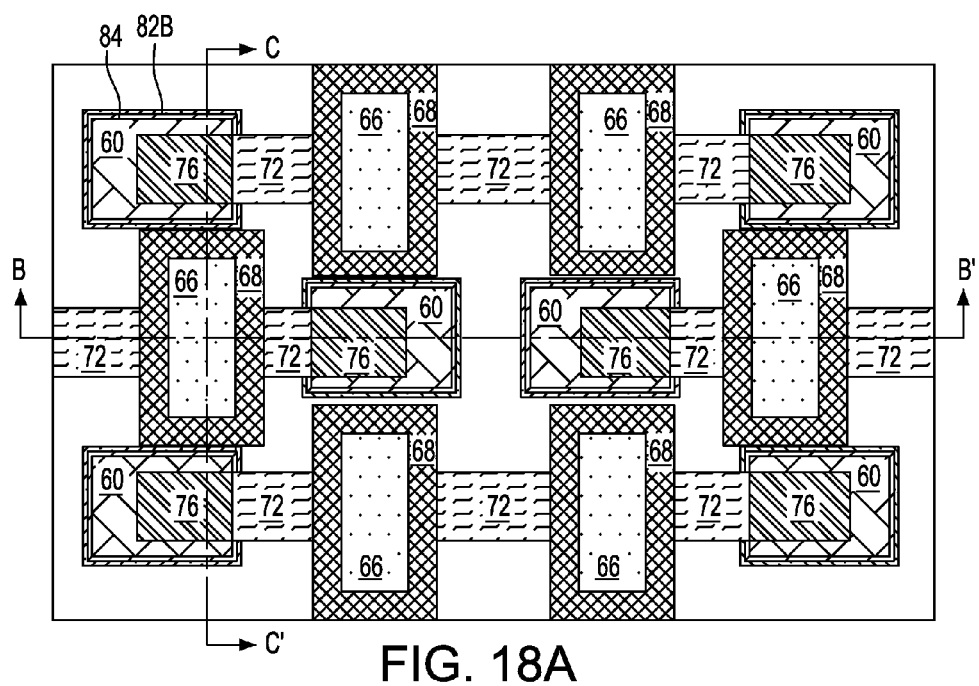
FIG. 18A is a top-down view of the second exemplary semiconductor structure of FIGS. 17A-17C after forming gate structures, source/drain regions, outer conductive strap structures and dielectric oxide liners underlying the dielectric nitride liners.
Figure 18B:
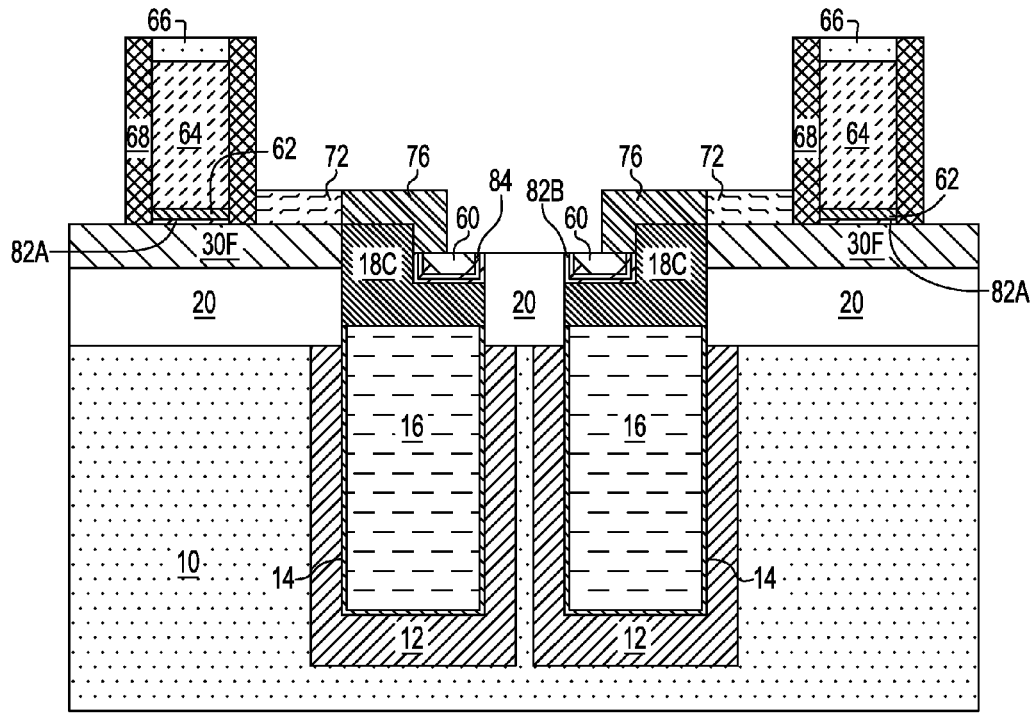
FIG. 18B is a cross-sectional view of the second exemplary semiconductor structure of FIG. 18A along the vertical plane B-B'.
Figure 18C:
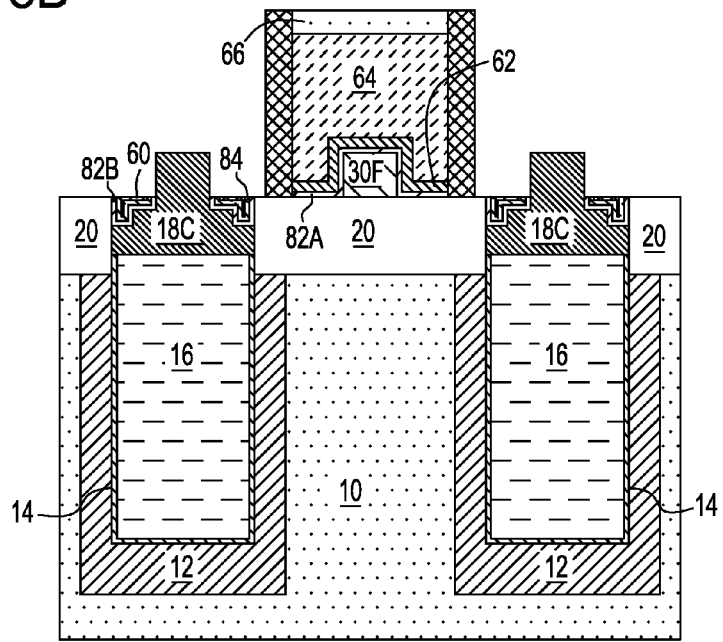
FIG. 18C is a cross-sectional view of the second exemplary semiconductor structure of FIG. 18A along the vertical plane C-C'.

Referring to FIGS. 18A-18C, processing steps of FIGS. 13A-13C are performed to provide gate structures (62, 64, 66, 68) each of which overlying a channel portion of a semiconductor fin 30F. During the lithographic patterning of the gate material stack, portions of the dielectric oxide layer 82L that are not covered by the patterned photoresist layer are also removed from exposed surfaces of the semiconductor fins 30 and the fin portions of the conductive strap structures 18C, and the top surface of the buried insulator layer 20. Each of the gate structures thus formed includes a gate stack including, for bottom to top, an interfacial dielectric oxide 82A which are remaining sub-portions of the dielectric oxide liner layer 82 underlying the patterned gate material stack, a gate dielectric 62, a gate electrode 64 and a gate cap 66, and a gate spacer 68 present on each sidewall of the gate stack (82A, 62, 64, 66). Remaining sub-portions of the dielectric oxide liner layer 82L located within the deep trenches 40 are herein referred to as the dielectric oxide liners 82B.

Subsequently, processing steps of FIGS. 14A-14C may be performed to form source/drain regions 72 on portions of the semiconductor fins 30F on opposite side of the gate structures (82A, 62, 64, 66, 68) and outer conductive strap structures 74 on exposed surfaces of the conductive strap structures 18C.

Figure 19A:
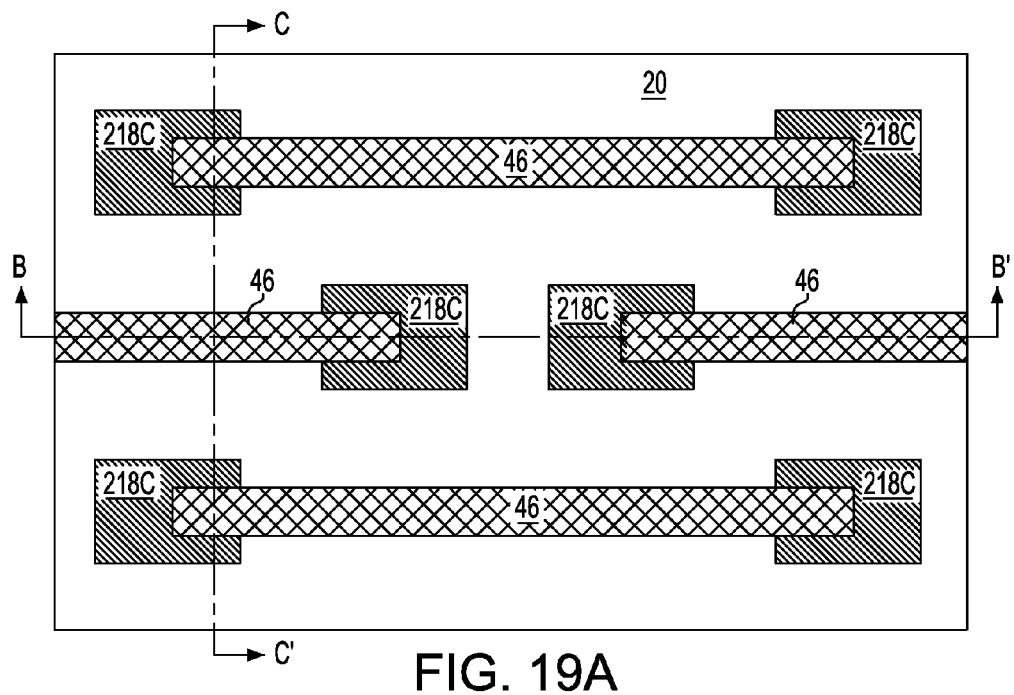
FIG. 19A is a top-down view of a third exemplary semiconductor structure that can be derived from the first exemplary semiconductor structure of FIGS. 5A-5C or FIG. 6 after forming conductive strap structures over the deep trench capacitors according to a third embodiment of the present application.
Figure 19B:
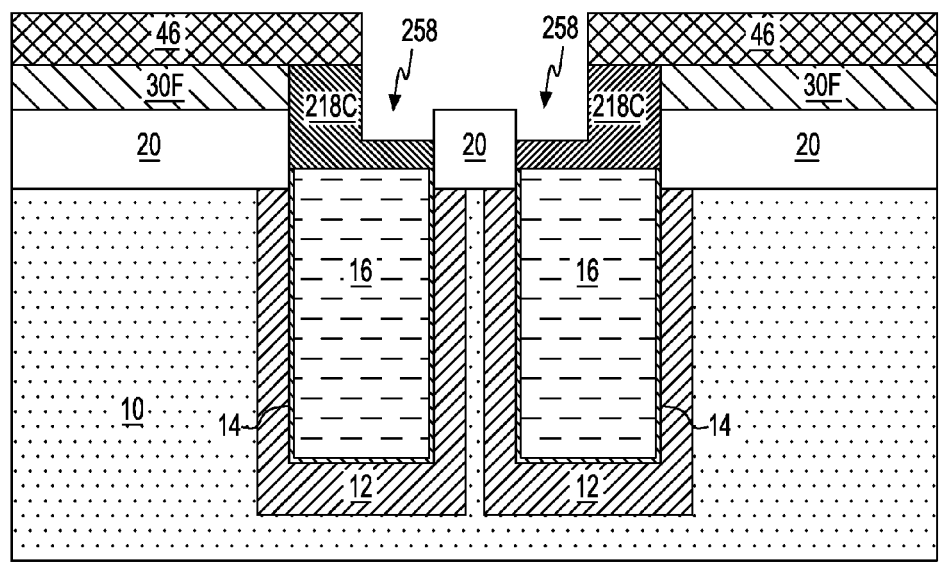
FIG. 19B is a cross-sectional view of the third exemplary semiconductor structure of FIG. 19A along the vertical plane B-B'.
Figure 19C:
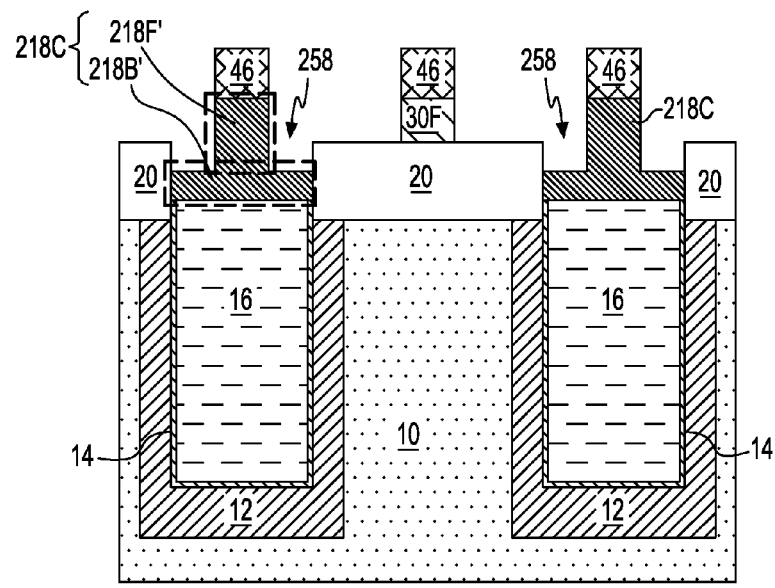
FIG. 19C is a cross-sectional view of the third exemplary semiconductor structure of FIG. 19A along the vertical plane C-C'.

Referring to FIGS. 19A-19C, a third exemplary semiconductor structure according to a third embodiment of the present application can be derived from the first exemplary semiconductor structure of FIGS. 5A-5C or FIG. 6 after removing unwanted portions of the semiconductor layer portions 30 (i.e., dummy fins) by performing processing steps of FIGS. 7A-7C, 8A-8B and 9A-9C to produce a conductive strap structure 218C with a fin portion 218F' and a base portion 218B' on top of each deep trench capacitor (12, 14, 16). The removal of the conductive spikes 50 can be omitted when the conductive material spikes 50 are present deep enough in the deep trenches 40 such that erosion of the dielectric cap later formed would never expose the conductive spikes 50. During the dummy fin cut process, a distal portion of a base portion of each conducive material cap portion 18A/218A (i.e., a portion of the base portion of the conductive material cap portion 18A/218A that is located away from the adjoined semiconductor layer portion 30) is recessed to a greater depth than that of a proximal portion of the conductive material portion 18A (i.e., a portion of the base portion over which the fin portion of the conducive material cap portion 18A/218A extends) because the proximal portion of the conductive material portion 18A/218A is covered by the fin cut mask. The base portion 218B' of each conductive strap structure 218C thus has a distal portion with a top surface vertically offset form a top surface of a proximal portion. The recessing of the conductive material cap portions 18A/218A forms a cavity 258 above the base portion 218B' of each conductive strap structure 218C in the deep trench 40.

Figure 20A:
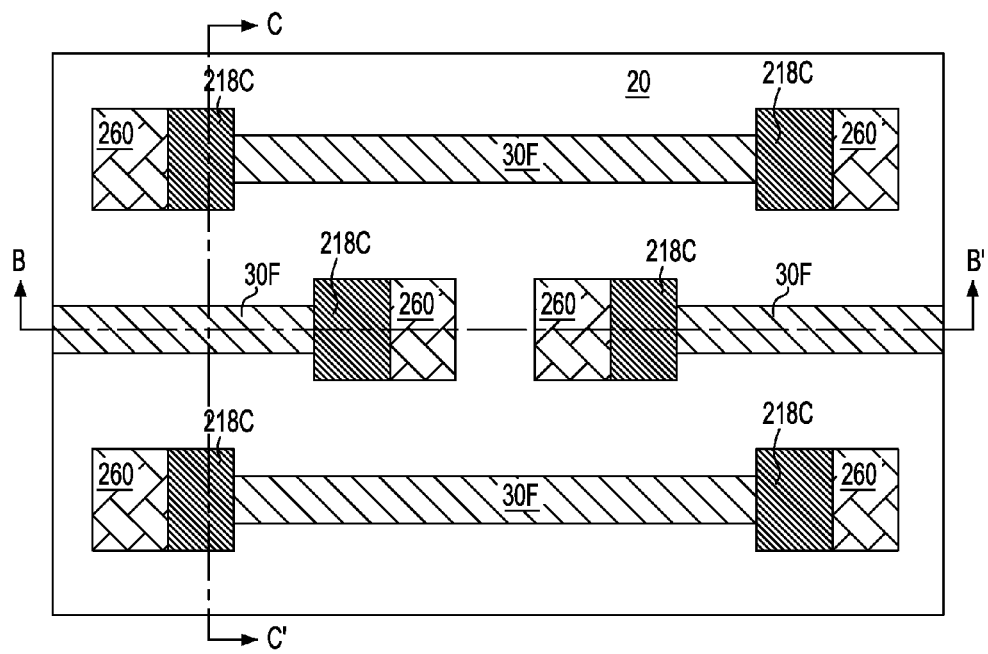
FIG. 20A is a top-down view of the third exemplary semiconductor structure of FIGS. 19A-19C after forming dielectric caps over distal portions of base portions of the conductive strap structures.
Figure 20B:
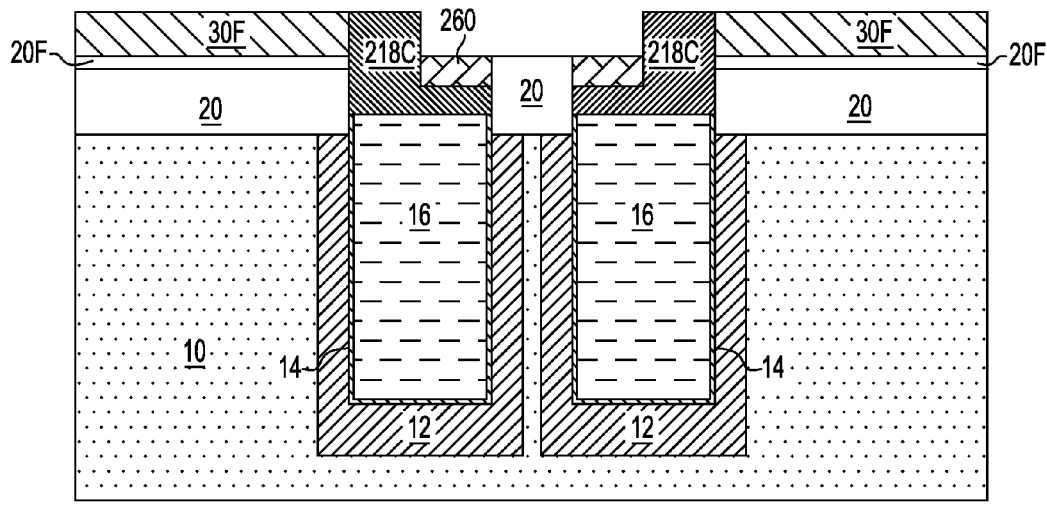
FIG. 20B is a cross-sectional view of the third exemplary semiconductor structure of FIG. 20A along the vertical plane B-B'.
Figure 20C:
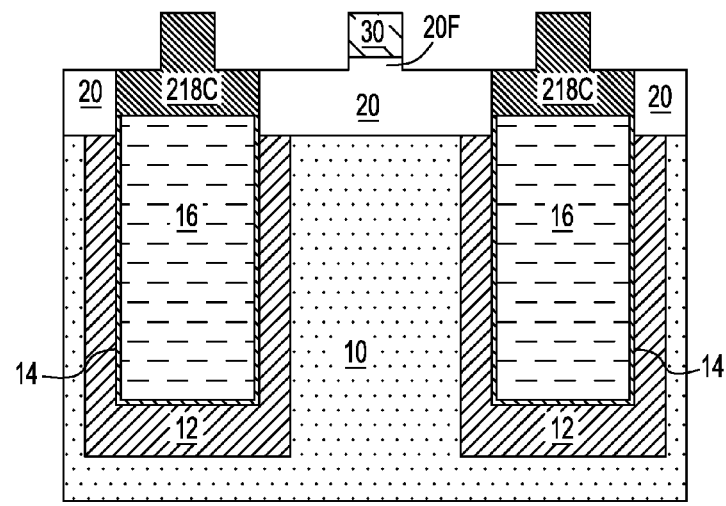
FIG. 20C is a cross-sectional view of the third exemplary semiconductor structure of FIG. 20A along the vertical plane C-C'.
Figure 21A:
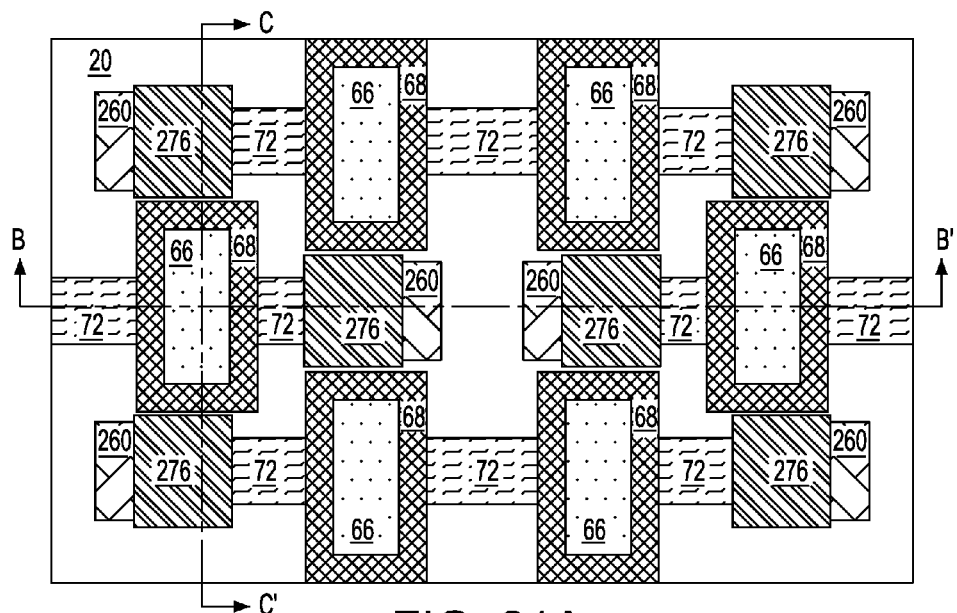
FIG. 21A is a top-down view of the third exemplary semiconductor structure of FIGS. 20A-20C after forming gate structures, source/drain regions and outer conductive strap structures.
Figure 21B:
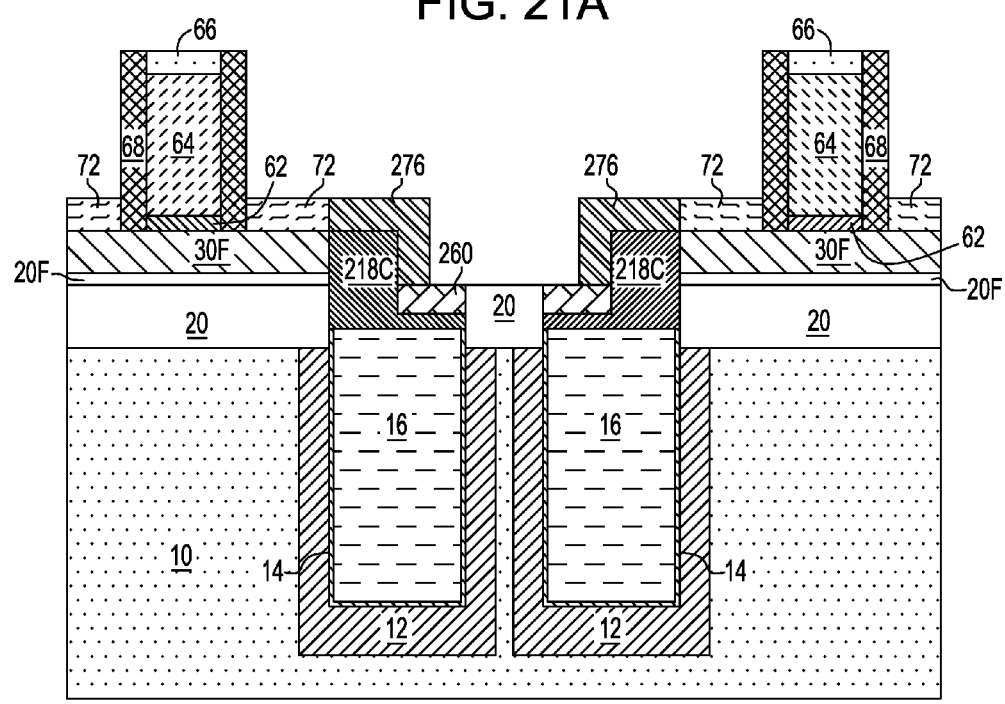
FIG. 21B is a cross-sectional view of the third exemplary semiconductor structure of FIG. 21A along the vertical plane B-B'.
Figure 21C:
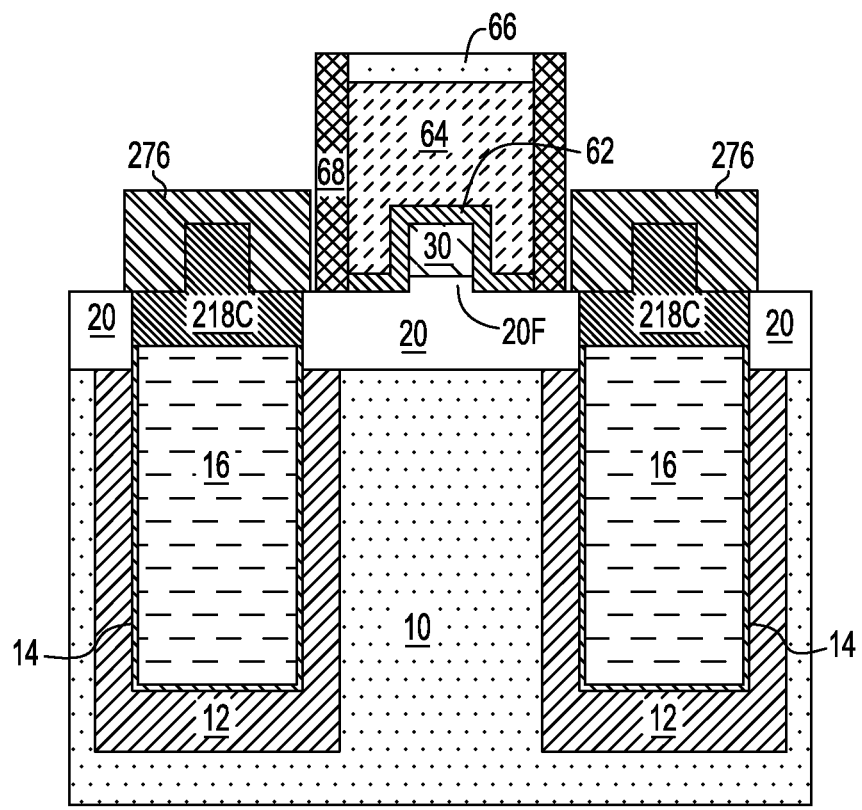
FIG. 21C is a cross-sectional view of the third exemplary semiconductor structure of FIG. 21A along the vertical plane C-C'.

Referring to FIGS. 20A-20C, a dielectric cap layer (not shown) is deposited in the cavities 258 and over the buried insulator layer 20 and the fin-defining mask structures 46 by the processing steps of FIGS. 11A-11C. The dielectric cap layer is then recessed vertically by an anisotropic etch that removes the dielectric material of the dielectric cap layer 40 selective to the semiconductor materials of the semiconductor fins 30F and the conductive strap structures 218C. In one embodiment, the dielectric cap layer is recessed to a depth such that portions of the dielectric cap layer that are present on the proximal portions of the base portions 218B' of the conductive strap structures 218C is completely removed. Remaining portions of the dielectric cap layer that are present on the distal portions of the base portions 218B' of the conductive strap structures 218C constitutes the dielectric caps 260. The etch chemistry employed to recess the dielectric cap layer also recesses exposed portions of the buried insulator layer 20 that are not covered by the semiconductor fins 30F, thus forming a dielectric fin 20F under each semiconductor fin. Each dielectric fin 20F and a corresponding overlying semiconductor fin 30F together constitutes a fin stack. The top surfaces of the proximal portions of the conductive strap structures 218C are coplanar with the recessed surface of the buried insulator layer 20.

Referring to FIGS. 20A-20C, processing steps of FIGS. 13A-13C are performed to provide gate structures each of which straddling over a portion of a vertical stack of a semiconductor fin 30F and a dielectric fin 20. Each of the gate structures thus formed includes a gate stack including, for bottom to top, a gate dielectric 62, a gate electrode 64 and a gate cap 66, and a gate spacer 68 present on each sidewall of the gate stack (62, 64, 66). Remaining sub-portions of the dielectric oxide liner layer 82L located within the deep trenches 40 are herein referred to as the dielectric oxide liners 82B.

Subsequently, processing steps of FIGS. 14A-14C may be performed to form source/drain regions 72 on portions of the semiconductor fins 30F on opposite side of the gate structures (82A, 62, 64, 66, 68) and outer conductive strap structures 274 on exposed surfaces of the conductive strap structures 18C. Due to the presence of the dielectric caps 260 on the distal portions of the base portions 218B' of the conductive strap structures 218C, the semiconductor material can only be epitaxially deposited on the proximal portions of the base portions 218B' of the conductive strap structures 218C, but not on the distal portions of the base portions 218B' of the conductive strap structures 218C. As a result, the electrical shorts between adjacent deep trench capacitors can be prevented.

While the application has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the application is intended to encompass all such alternatives, modifications and variations which fall within the scope and spirit of the application and the following claims.

What is claimed is:

1. A semiconductor structure comprising:
a semiconductor fin located on a substrate;
a deep trench capacitor located in a lower portion of a deep trench in the substrate;
a conductive strap structure located over the deep trench capacitor, wherein the conductive strap structure comprises a stepped base portion vertically contacting the deep trench capacitor and a fin portion extending from the base portion and laterally contacting the semiconductor fin, the stepped base portion having a first recessed surface located below a topmost surface of the substrate by a first depth and a second recessed surface located below the topmost surface of the substrate by a second depth that is greater than the first depth; and
a dielectric cap located over the base portion of the conductive strap structure and completely filling the deep trench.

2. The semiconductor structure of claim 1, wherein the dielectric cap laterally surrounds a lower portion of the fin portion of the conductive strap structure.

3. The semiconductor structure of claim 2, wherein a sidewall surface of the base portion of the conductive strap structure extends from the first recessed surface to the second recessed surface.

4. The semiconductor structure of claim 3, wherein the first recessed surface adjoins the fin portion of the conductive strap structure and is coplanar with an interface between the fin portion and the base portion, and wherein the second recessed surface adjoins sidewalls of the deep trench.

5. The semiconductor structure of claim 1, wherein a sidewall of the semiconductor fin and a sidewall of the conductive strap structure are within a same vertical plane.

6. The semiconductor structure of claim 1, wherein topmost surfaces of the deep trench capacitor are located between a top surface of a buried insulator layer of the substrate and a bottom surface of the buried insulator layer.

7. The semiconductor structure of claim 1, further comprising at least one dielectric liner present between the conductive strap structure and the dielectric cap.

8. The semiconductor structure of claim 7, wherein the at least one dielectric liner comprises a dielectric oxide liner in contact with the conductive strap structure, and a dielectric nitride liner overlying the dielectric oxide liner and contacting the dielectric cap.

9. A semiconductor structure comprising
a fin stack located on a substrate, the fin stack comprising a dielectric fin and a semiconductor fin atop the dielectric fin
a deep trench capacitor located in a lower portion of a deep trench in the substrate;

a conductive strap structure located over the deep trench capacitor, wherein the conductive strap structure comprises a base portion vertically contacting the deep trench capacitor and a fin portion extending from the base portion and laterally contacting the fin stack, the base portion having a proximal portion over which the fin portion extends and a distal portion that is away from the fin stack, wherein the proximal portion of the base portion has a top surface coplanar with a topmost surface of the substrate, and wherein the distal portion of the base portion has a top surface below the topmost surface of the substrate; and a dielectric cap located over the distal portion of the base portion and completely filling the deep trench.

10. The semiconductor structure of claim 9, wherein a top surface of the dielectric cap is coplanar with the top surface of the proximal portion of the base portion.

11. The semiconductor structure of claim 10, wherein an entirety of the fin portion of the conductive strap structure laterally contacts the fin stack.

12. The semiconductor structure of claim 11, further comprising a gate structure over a portion of the fin stack, wherein the gate structure comprises a gate stack including a gate dielectric contacting a top surface and sidewalls of the fin stack, a gate electrode overlying the gate dielectric and a gate cap overlying the gate electrode, and a gate spacer present on each sidewall of the gate stack.

13. The semiconductor structure of claim 12, further comprising source/drain regions present on portions of the semiconductor fin located on opposite sides of the gate structure, and an outer conductive strap structure present over the proximal portion of the base portion and the fin portion of the conductive strap structure and a portion of the dielectric cap.

* * * * *